United States Patent
Suk et al.

(10) Patent No.: US 9,679,965 B1
(45) Date of Patent: Jun. 13, 2017

(54) SEMICONDUCTOR DEVICE HAVING A GATE ALL AROUND STRUCTURE AND A METHOD FOR FABRICATING THE SAME

(71) Applicant: SAMSUNG ELECTRONICS CO., LTD., Suwon-si, Gyeonggi-do (KR)

(72) Inventors: Sung Dae Suk, Seoul (KR); Bom-Soo Kim, Seoul (KR); Kang-Ill Seo, Chungcheongbuk-Do (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 14/961,213

(22) Filed: Dec. 7, 2015

(51) Int. Cl.
H01L 29/06 (2006.01)
H01L 29/423 (2006.01)
H01L 29/78 (2006.01)
H01L 29/51 (2006.01)
H01L 29/417 (2006.01)
H01L 27/12 (2006.01)

(52) U.S. Cl.
CPC ...... H01L 29/0673 (2013.01); H01L 27/1211 (2013.01); H01L 29/41775 (2013.01); H01L 29/42392 (2013.01); H01L 29/511 (2013.01); H01L 29/785 (2013.01)

(58) Field of Classification Search
CPC .......... H01L 29/0673; H01L 27/1211; H01L 29/41775; H01L 29/42392; H01L 29/511; H01L 29/785; H01L 29/0847; H01L 29/66787; H01L 29/7858; H01L 29/66439; H01L 29/775
See application file for complete search history.

(56) References Cited

U.S. PATENT DOCUMENTS

| | | | |
|---|---|---|---|
| 7,279,375 B2 | 10/2007 | Radosavljevic et al. | |
| 7,586,130 B2 | 9/2009 | Kawashima et al. | |
| 7,898,043 B2 | 3/2011 | Ziglioli et al. | |
| 7,948,050 B2 | 5/2011 | Appenzeller et al. | |
| 8,362,582 B2 | 1/2013 | Appenzeller et al. | |
| 8,399,314 B2 | 3/2013 | Cohen et al. | |
| 8,445,892 B2 | 5/2013 | Cohen et al. | |
| 8,518,769 B2 | 8/2013 | Ota et al. | |
| 8,551,833 B2 | 10/2013 | Chang et al. | |
| 8,629,515 B2 * | 1/2014 | Yeh .................. | H01L 21/28105 257/249 |
| 8,637,361 B2 | 1/2014 | Appenzeller et al. | |
| 8,765,539 B2 | 7/2014 | Appenzeller et al. | |

(Continued)

FOREIGN PATENT DOCUMENTS

| | | |
|---|---|---|
| JP | 4568286 | 8/2010 |
| JP | 2012-244088 | 12/2012 |

(Continued)

Primary Examiner — Scott B Geyer
(74) Attorney, Agent, or Firm — F. Chau & Associates, LLC

(57) ABSTRACT

A semiconductor device includes a wire pattern spaced apart from a substrate and extended in a first direction, a gate electrode disposed around a circumference of the wire pattern and extended in a second direction that is different from the first direction, a source disposed on a first side of the gate electrode, a drain disposed on a second side of the gate electrode, the source and the drain connected to the wire pattern and a gate spacer disposed on first and second sidewalls of the gate electrode, on the source and on the drain.

11 Claims, 25 Drawing Sheets

(56) References Cited

U.S. PATENT DOCUMENTS

| | | | |
|---|---|---|---|
| 8,772,109 B2* | 7/2014 | Colinge | H01L 29/41791 |
| | | | 257/192 |
| 8,835,238 B2 | 9/2014 | Appenzeller et al. | |
| 8,901,538 B2 | 12/2014 | Yu et al. | |
| 8,987,794 B2* | 3/2015 | Rachmady | H01L 29/42392 |
| | | | 257/288 |
| 9,070,770 B2* | 6/2015 | Basu | H01L 29/785 |
| 2006/0202266 A1 | 9/2006 | Radosavljevic et al. | |
| 2008/0061370 A1* | 3/2008 | Matsuo | H01L 29/41791 |
| | | | 257/347 |
| 2012/0043593 A1* | 2/2012 | Zhong | H01L 21/82381 |
| | | | 257/288 |
| 2013/0187129 A1 | 7/2013 | Cheng et al. | |
| 2013/0299907 A1 | 11/2013 | Ota et al. | |
| 2014/0034908 A1 | 2/2014 | Bangsaruntip et al. | |
| 2014/0084249 A1 | 3/2014 | Basker et al. | |
| 2016/0240652 A1* | 8/2016 | Ching | H01L 29/785 |

FOREIGN PATENT DOCUMENTS

| | | |
|---|---|---|
| JP | 2013-524487 | 6/2013 |
| JP | 5325932 | 7/2013 |
| KR | 1020080024168 | 3/2008 |
| KR | 1020090106554 | 10/2009 |
| KR | 101289666 | 7/2013 |
| KR | 1020140011665 | 1/2014 |
| WO | 2006/038504 | 4/2006 |
| WO | 2008/088669 | 7/2008 |
| WO | 2011/119717 | 9/2011 |

* cited by examiner

SEMICONDUCTOR DEVICE HAVING A GATE ALL AROUND STRUCTURE AND A METHOD FOR FABRICATING THE SAME

TECHNICAL FIELD

The present inventive concept relates to a semiconductor device and a method for fabricating the same, and more particularly, to a semiconductor device having a gate all around structure and a method for fabricating the same.

DESCRIPTION OF THE RELATED ART

In an example scaling technique to increase the density of a semiconductor device, a gate all around structure has been developed. In the gate all around structure, a nanowire-shaped silicon body is formed on a substrate and a gate is formed to surround the silicon body.

Since the gate all around structure uses a three-dimensional (3D) channel, scaling is achieved. Further, current is controlled without increasing the length of the gate. In addition, a short channel effect (SCE) in which an electric potential of a channel region is affected by a drain voltage can be suppressed.

SUMMARY

According to an exemplary embodiment of the present inventive concept, there is provided a semiconductor device comprising a wire pattern spaced apart from a substrate and extended in a first direction, a gate electrode disposed around a circumference of the wire pattern and extended in a second direction that is different from the first direction, a source disposed on a first side of the gate electrode, a drain disposed on a second side of the gate electrode, the source and the drain connected to the wire pattern and a gate spacer disposed on first and second sidewalls of the gate electrode, on the source and on the drain.

In an exemplary embodiment of the present inventive concept, the semiconductor device may further comprise an insulating layer formed on a part of an upper surface of the source and a part of an upper surface of the drain, wherein the gate spacer is formed on the insulating layer.

In an exemplary embodiment of the present inventive concept, the semiconductor device may further comprise a gate insulating layer formed between the gate electrode and the source and between the gate electrode and the drain.

In an exemplary embodiment of the present inventive concept, an upper surface of the gate insulating layer is coplanar with an upper surface of the gate electrode.

In an exemplary embodiment of the present inventive concept, the gate insulating layer comprises an interfacial layer and a high-k insulating layer.

In an exemplary embodiment of the present inventive concept, the semiconductor device may further comprise an insulating spacer formed between the source and the gate electrode and between the drain and the gate electrode.

In an exemplary embodiment of the present inventive concept, a width of the insulating spacer is less than a width of the gate spacer.

In an exemplary embodiment of the present inventive concept, the source and the drain extend in the first direction, the semiconductor device further comprises an insulating layer formed on an upper surface and a side surface of each of the source and the drain, and a first part of the gate spacer overlaps the source and the drain, and a second part of the gate spacer overlaps the insulating layer.

In an exemplary embodiment of the present inventive concept, the semiconductor device may further comprise a contact formed on the source or the drain and spaced apart from the gate electrode.

In an exemplary embodiment of the present inventive concept, a lower surface of the gate spacer directly contacts an upper surface of the source and the drain.

According to an exemplary embodiment of the present inventive concept, there is provided a semiconductor device comprising first and second wire patterns spaced apart from a substrate and extended in a first direction, and spaced apart from each other in a second direction that crosses the first direction, a gate electrode disposed around a circumference of each of the first and second wire patterns and extending in the second direction, a first source disposed on a first side of the gate electrode and a first drain disposed on a second side of the gate electrode and connected to the first wire pattern, a second source disposed on the first side of the gate electrode and a second drain disposed on the second side of the gate electrode and connected to the second wire pattern, and a gate spacer disposed on first and second sidewalls of the gate electrode, on the first and second sources and on the first and second drains.

In an exemplary embodiment of the present inventive concept, the first and second sources are connected to each other and the first and second drains are connected to each other.

In an exemplary embodiment of the present inventive concept, the first and second sources are spaced apart from each other in the second direction and the first and second drains are spaced apart from each other in the second direction.

In an exemplary embodiment of the present inventive concept, the semiconductor device may further comprise an insulating layer formed between the first and second sources and the first and second drains.

In an exemplary embodiment of the present inventive concept, the semiconductor device may further comprise an insulating spacer formed between the first and second sources and the gate electrode and the first and second drains and the gate electrode.

According to an exemplary embodiment of the present inventive concept, there is provided a semiconductor device comprising: a fin pattern protruding from a substrate and extending in a first direction; a field insulating layer disposed on first and second sides of the fin pattern; a wire pattern disposed above and apart from the fin pattern and extending in the first direction; a gate electrode disposed between the fin pattern and the wire pattern and above the wire pattern and extending in a second direction different from the first direction; a source disposed on a first side of the gate electrode and connected to the wire pattern; a drain disposed on a second side of the gate electrode and connected to the wire pattern; a first gate spacer disposed on a first sidewall of the gate electrode on the source; and a second gate spacer disposed on a second sidewall of the gate electrode on the drain.

In an exemplary embodiment of the present inventive concept, the fin pattern and the wire pattern include the same material.

In an exemplary embodiment of the present inventive concept, the semiconductor device further comprises an insulating layer disposed on first and second sides of each of the source and the drain.

In an exemplary embodiment of the present inventive concept, the semiconductor device further comprises a gate insulating layer disposed between the first gate spacer and the gate electrode and between the second gate spacer and the gate electrode.

In an exemplary embodiment of the present inventive concept, the first and second gate spacers are spaced apart from the wire pattern.

BRIEF DESCRIPTION OF THE DRAWINGS

The above and other features of the present inventive concept will become more apparent by describing in detail exemplary embodiments thereof in conjunction with the accompanying drawings, in which.

DETAILED DESCRIPTION OF THE EMBODIMENTS

Exemplary embodiments of the present inventive concept will now be described more fully hereinafter with reference to the accompanying drawings. This inventive concept may, however, be embodied in different forms and should not be construed as limited to the embodiments set forth herein. The same reference numbers may indicate the same components throughout the specification. In the attached figures, the thickness of layers and regions may be exaggerated for clarity.

It will be understood that when an element or layer is referred to as being "connected to," or "coupled to" another element or layer, it can be directly connected to or coupled to another element or layer or intervening elements or layers may be present.

It will also be understood that when a layer is referred to as being "on" another layer or substrate, it can be directly on the other layer or substrate, or intervening layers may also be present.

The use of the terms "a" and "an" and "the" and similar referents in the context of describing the present inventive concept are to be construed to cover both the singular and the plural, unless otherwise indicated herein or clearly contradicted by context.

Hereinafter, referring to FIGS. 1 to 4, a semiconductor device according to an exemplary embodiment of the present inventive concept will be described.

Figure 1:
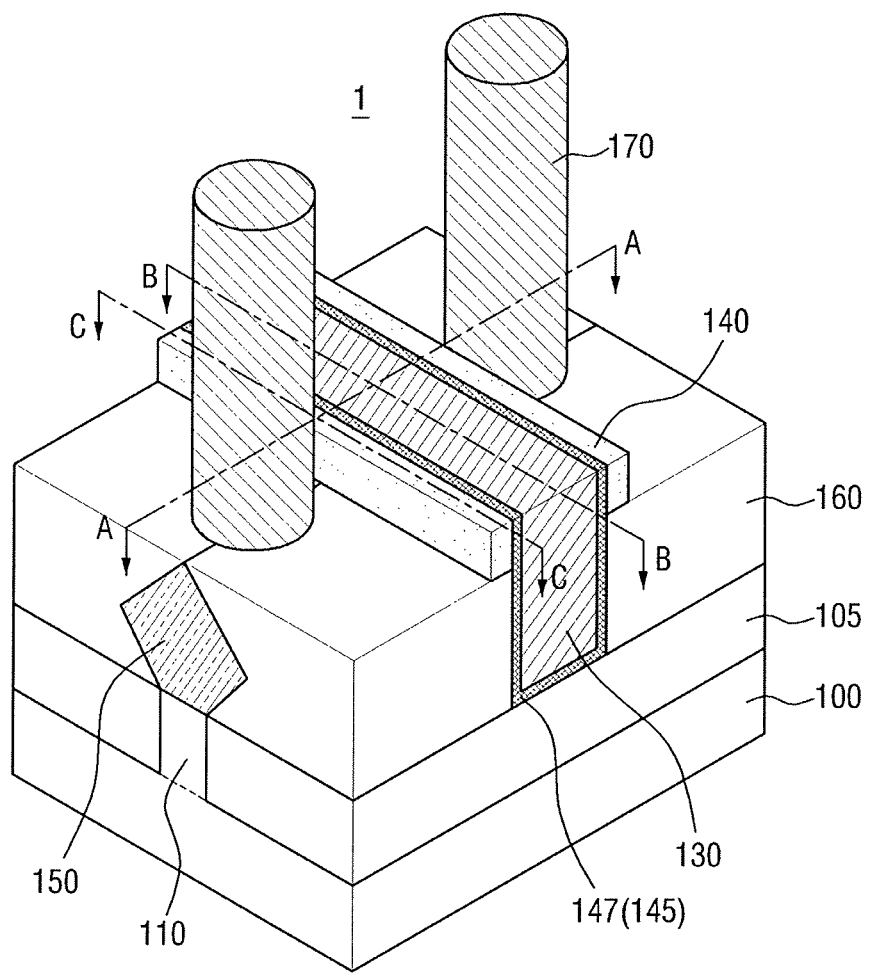
FIG. 1 is a cross-sectional view of a semiconductor device according to an exemplary embodiment of the present inventive concept.
Figure 2:
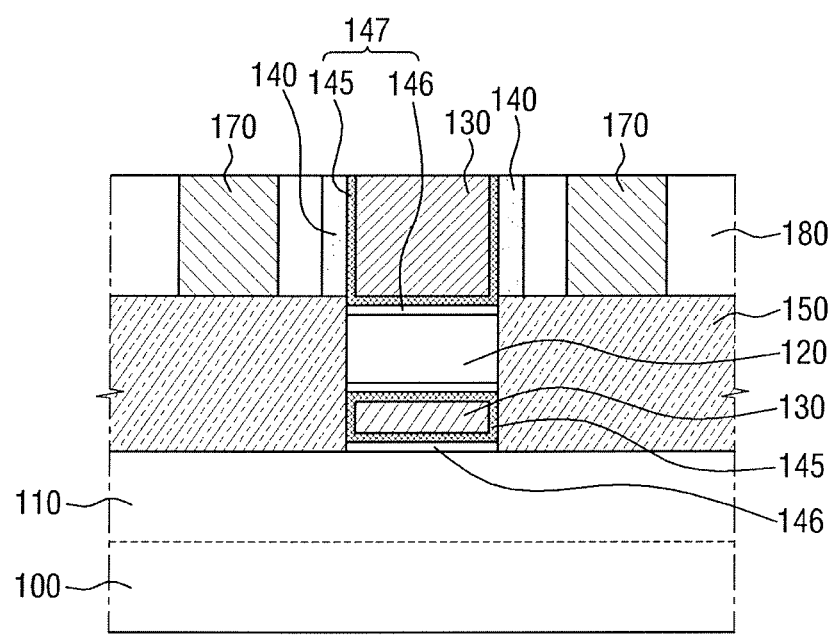
FIG. 2 is a cross-sectional view taken along line A-A of FIG. 1, according to an exemplary embodiment of the present inventive concept.
Figure 3:
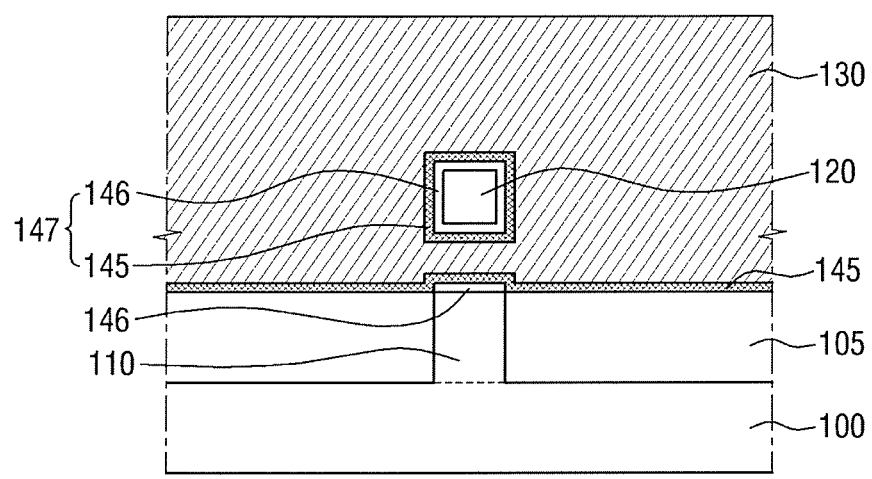
FIG. 3 is a cross-sectional view taken along line B-B of FIG. 1, according to an exemplary embodiment of the present inventive concept.
Figure 4:
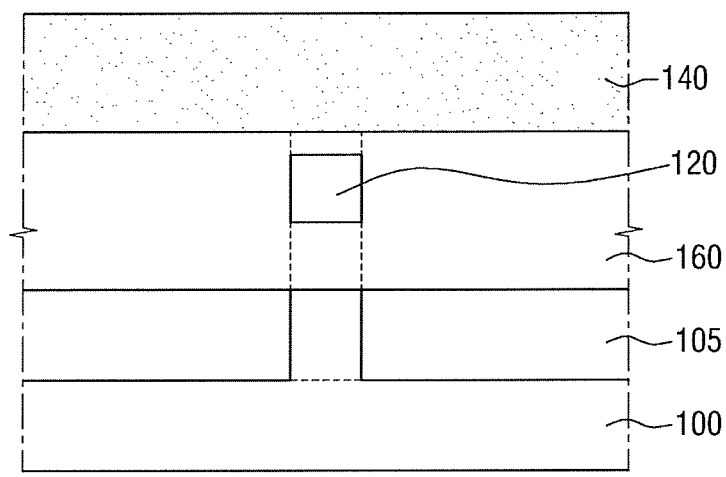
FIG. 4 is a cross-sectional view taken along line C-C of FIG. 1, according to an exemplary embodiment of the present inventive concept.

FIG. 1 is a cross-sectional view of a semiconductor device according to an exemplary embodiment of the present inventive concept. FIG. 2 is a cross-sectional view taken along line A-A of FIG. 1, according to an exemplary embodiment of the present inventive concept, FIG. 3 is a cross-sectional view taken along line B-B of FIG. 1, according to an exemplary embodiment of the present inventive concept, and FIG. 4 is a cross-sectional view taken along line C-C of FIG. 1, according to an exemplary embodiment of the present inventive concept. For convenience in explanation, a second interlayer insulating layer 180 is not illustrated in FIG. 1.

In a semiconductor device 1 shown in FIGS. 1 to 4, a substrate 100 may include, for example, bulk silicon or Silicon-On-Insulator (SOI). The substrate 100 may be a silicon substrate, or may include another material, such as silicon germanium, indium antimonide, lead telluride, indium arsenide, indium phosphide, gallium arsenide, or gallium antimonide. Further, the substrate 100 may be provided by forming an epitaxial layer on a base substrate.

In the semiconductor device 1 shown in FIGS. 1 to 4, a fin pattern 110 may project from the substrate 100. A field insulating layer 105 may surround at least a part of a side wall of the fin pattern 110. The fin pattern 110 may be defined by the field insulating layer 105. The field insulating layer 105 may include, for example, an oxide layer, a nitride layer, an oxynitride layer, or a combination thereof.

FIG. 1 illustrates that the sidewall of the fin pattern 110 is entirely surrounded by the field insulating layer 105. However, this is merely for convenience in explanation, and the present inventive concept is not limited thereto.

The fin pattern 110 may extend lengthwise in a first direction X. In other words, the fin pattern 110 may include a long side that extends in the first direction X and a short side that extends in a second direction Y.

The fin pattern 110 may be formed through etching of a part of the substrate 100, or may include an epitaxial layer that is grown from the substrate 100. The fin pattern 110 may include, for example, silicon or germanium that is an element semiconductor material. Further, the fin pattern 110 may include a compound semiconductor, and for example, may include a group IV-IV compound semiconductor or a group III-V compound semiconductor.

For example, according to the group IV-IV compound semiconductor, the fin pattern 110 may include a binary compound including at least two of carbon (C), silicon (Si), germanium (Ge), and tin (Sn), a ternary compound, or a compound including the above-described elements doped with group IV elements.

According to the group III-V compound semiconductor, the fin pattern 110 may include a binary compound formed through combination of at least one of group III elements, such as aluminum (Al), gallium (Ga), and indium (In), and one of group V elements, such as phosphorus (P), arsenide (As), and antimonium (Sb), a ternary compound, or a quaternary compound.

In the semiconductor device 1 and those described hereinafter according to exemplary embodiments of the present inventive concept, the fin pattern 110 includes silicon.

A wire pattern 120 may be formed on the substrate 100 and be spaced apart from the substrate 100. The wire pattern 120 may extend in the first direction X.

For example, the wire pattern 120 may be formed on the fin pattern 110 and be spaced apart from the fin pattern 110. The wire pattern 120 may overlap the fin pattern 110. The wire pattern 120 may not be formed on the field insulating layer 105, but may be formed on the fin pattern 110.

FIG. 3 illustrates that the width of the wire pattern 120 in the second direction Y is equal to the width of the fin pattern 110 in the second direction Y. However, this is merely for convenience in explanation, and the present inventive concept is not limited thereto. Further, it is illustrated that the wire pattern 120 has a rectangular cross section, but is not limited thereto. Through a trimming process, the wire pattern 120 may have rounded corners.

The wire pattern 120 may be used as a channel region of a transistor. The wire pattern 120 may differ depending on whether the semiconductor device 1 is a p-type metal-oxide semiconductor (PMOS) type or an n-type metal-oxide-semiconductor (NMOS) type, but is not limited thereto.

Further, the wire pattern 120 may include the same material as the fin pattern 110 or may include a material that is different from the material of the fin pattern 110. However, for convenience in explanation, the wire pattern 120 includes silicon in the semiconductor device 1 and those described hereinafter according to exemplary embodiments of the present inventive concept.

A gate electrode 130 may be formed on the field insulating layer 105 and the fin pattern 110. The gate electrode 130 may extend in the second direction Y.

The gate electrode 130 may surround the circumference of the wire pattern 120 that is spaced apart from an upper surface of the fin pattern 110. The gate electrode 130 may also be formed in a gap (e.g., a space) between the wire pattern 120 and the fin pattern 110.

The gate electrode 130 may include a conductive material. In FIGS. 1 to 3, the gate electrode 130 is illustrated as a single layer, but is not limited thereto. In other words, the gate electrode 130 may include a work function conductive layer that adjusts a work function and a filling conductive layer that fills a space that is formed by the work function conductive layer.

The gate electrode 130 may include, for example, TiN, WN, TaN, Ru, TiC, TaC, Ti, Ag, Al, TiAl, TiAlN, TiAlC, TaCN, TaSiN, Mn, Zr, W, or Al. Further, the gate electrode 130 may include Si or SiGe that is not metal. The gate electrode 130 as described above may be formed, for example, through a replacement process, but is not limited thereto.

A gate insulating layer 147 may be formed between the wire pattern 120 and the gate electrode 130. Further, the gate insulating layer 147 may also be formed between the field insulating layer 105 and the gate electrode 130.

For example, the gate insulating layer 147 may include an interfacial layer 146 and a high-k insulating layer 145, but is not limited thereto. In other words, depending on the materials of the wire pattern 120, the interfacial layer 146 of the gate insulating layer 147 may be omitted.

Since the interfacial layer 146 is formed on the circumference of the wire pattern 120, it may be formed between the wire pattern 120 and the gate electrode 130 and between the fin pattern 110 and the gate electrode 130. The high-k insulating layer 145 may be formed between the wire pattern 120 and the gate electrode 130, between the fin pattern 110 and the gate electrode 130, between the field insulating layer 105 and the gate electrode 130, and between a gate spacer 140 and the gate electrode 130.

The gate insulating layer 147 may be formed along the circumference of the wire pattern 120. The gate insulating layer 147 may be formed along the upper surface of the field insulating layer 105 and the upper surface of the fin pattern 110. In addition, the gate insulating layer 147 may be formed along sidewalls of a source/drain 150 and an interlayer insulating layer 160.

In the case where the wire pattern 120 includes silicon, the interfacial layer 146 may include a silicon oxide layer. In this case, the interfacial layer 146 may be formed on the circumference of the wire pattern 120 and the upper surface of the fin pattern 110, but may not be formed along the sidewalls of the source/drain 150 and the interlayer insulating layer 160.

The high-k insulating layer 145 may include a high-k material having a higher dielectric constant than the dielectric constant of the silicon oxide layer. For example, the high-k material may include hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate, but is not limited thereto.

In the case where the interfacial layer 146 is omitted, the high-k insulating layer 145 may include the above-described high-k material as well as a silicon oxide layer, a silicon oxynitride layer, or a silicon nitride layer.

The source/drain 150 may be formed on both sides of the gate electrode 130. The source/drain 150 may be formed on the fin pattern 110. The source/drain 150 may include an epitaxial layer that is formed on the upper surface of the fin pattern 110.

The outer circumference of the source/drain 150 may have various shapes. For example, the outer circumference of the source/drain 150 may have a diamond shape, a circular shape, a rectangular shape, or an octagonal shape. FIG. 1 illustrates a diamond shape (or a pentagonal shape). The diamond shape may also be a hexagonal shape. The source/drain 150 may be directly connected to the wire pattern 120 that is used as a channel region.

The first interlayer insulating layer 160 may be formed on both sidewalls of the gate electrode 130 that extends in the second direction Y. For example, the first interlayer insulating layer 160 may be formed on a side surface of the gate insulating layer 147 that is positioned on both sidewalls of the gate electrode 130.

In the case where the semiconductor device 1 is a PMOS transistor, the source/drain 150 may include a compressive stress material. For example, the compressive stress material may be a material having a high lattice constant, and may be, for example, SiGe. The compressive stress material may apply a compressive stress to the wire pattern 120 to increase carrier mobility of a channel region.

In the case where the semiconductor device 1 is an NMOS transistor, the source/drain 150 may include a tensile stress material. The source/drain 150 may be include the same material as the substrate 100, or may include the tensile stress material. For example, in the case where the substrate 100 includes Si, the source/drain 150 may be Si or a material having a lower lattice constant than the lattice constant of Si (e.g., SiC or SiP).

The first interlayer insulating layer 160 may be formed on the side surface of the source/drain 150. The first interlayer insulating layer 160 may be formed to surround the source/ drain 150. The upper surface of the first interlayer insulating layer 160 may be at the same level as the uppermost surface of the source/drain 150. The upper surface of the source/drain 150 may have a predetermined slope with respect to the horizontal direction. Accordingly, as illustrated, only a part of the upper surface of the source/drain 150 may be exposed, but the remaining part of the upper surface of the source/drain 150 may be hidden by the first interlayer insulating layer 160. As illustrated, the exposed upper surface of the source/drain 150 may have a corner shape, but is not limited thereto.

The first interlayer insulating layer 160 may include a low-k material, an oxide layer, a nitride layer, or an oxynitride layer. The low-k material may be, for example, Flowable Oxide (FOX), Tonen SilaZen (TOSZ), Undoped Silica Glass (USG), Borosilica Glass (BSG), PhosphoSilaca Glass (PSG), BoroPhosphoSilica Glass (BPSG), Plasma Enhanced Tetra Ethyl Ortho Silicate (PETEOS), Fluoride Silicate Glass (FSG), High Density Plasma (HDP) oxide, Plasma Enhanced Oxide (PEOX), Flowable Chemical Vapor Deposition (FCVD) oxide, or a combination thereof.

The gate spacer 140 may be formed on both sidewalls of the gate electrode 130 that extends in the second direction Y. The gate spacer 140 may overlap a part of the sidewall of the gate electrode 130. For example, the gate spacer 140 may be formed on the source/drain 150. In other words, the gate spacer 140 may not overlap the source/drain 150 in the vertical direction.

The gate spacer 140 may be formed on the first interlayer insulating layer 160. The gate spacer 140 may be formed on the first interlayer insulating layer 160 and the source/drain 150. A part of the lower surface of the gate spacer 140 may contact the first interlayer insulating layer 160, and the remaining part of the lower surface of the gate spacer 140 may contact the source/drain 150, but are not limited thereto. In other words, the uppermost surfaces of the first interlayer insulating layer 160 and the source/drain 150 may be at the same level. The gate spacer 140 may be formed on a planar surface formed by the uppermost surfaces of the first interlayer insulating layer 160 and the source/drain 150.

The gate spacer 140 may overlap the source/drain 150 in the horizontal direction. In other words, a part of the source/drain 150 may overlap the gate spacer 140 in the horizontal direction. The part of the source/drain 150 that overlaps the gate spacer 140 may be a portion of the source/drain 150 that is adjacent to the wire pattern 120.

The upper surface of the gate spacer 140 may be on the same plane as the upper surface of the gate electrode 130.

The gate spacer 140 may include, for example, silicon nitride (SiN), silicon oxynitride (SiON), silicon oxide ($SiO_2$), silicon oxycarbonitride (SiOCN), or a combination thereof.

A contact 170 may be formed on the source/drain 150. The contact 170 may be electrically connected to the source/drain 150. The contact 170 may be formed to penetrate the first interlayer insulating layer 160 and the second interlayer insulating layer 180. In other words, the contact 170 may directly contact the source/drain 150. The contact 170 may be formed on both side surfaces of the gate electrode 130.

The contact 170 may include a conductive material. The contact 170 may include, for example, metal or polysilicon, but is not limited thereto. In FIG. 1, the contact 170 is illustrated to have a cylindrical shape. However, this is merely exemplary, and the shape of the contact 170 is not limited thereto.

The semiconductor device 1 according to the current embodiment of the present inventive concept does not include a spacer that separates the gate electrode 130 and the source/drain 150 from each other. Accordingly, the area or volume in which the source/drain 150 is formed may be widened. Accordingly, as the area of the source/drain 150 becomes larger, a contact margin becomes greater to increase the performance of the semiconductor device 1.

The source/drain 150 of the semiconductor device 1 according to the current embodiment of the present inventive concept may have a relatively high compressive or tensile stress. Accordingly, the carrier mobility of the channel region can be increased. Since the carrier mobility is increased, the resistance of the channel region is decreased, and the performance of the semiconductor device 1 can be increased.

Hereinafter, referring to FIG. 5, a semiconductor device according to an exemplary embodiment of the present inventive concept will be described. For convenience in explanation, the following description will focus primarily on elements and features different from those as described above with reference to FIGS. 1 to 4.

Figure 5:
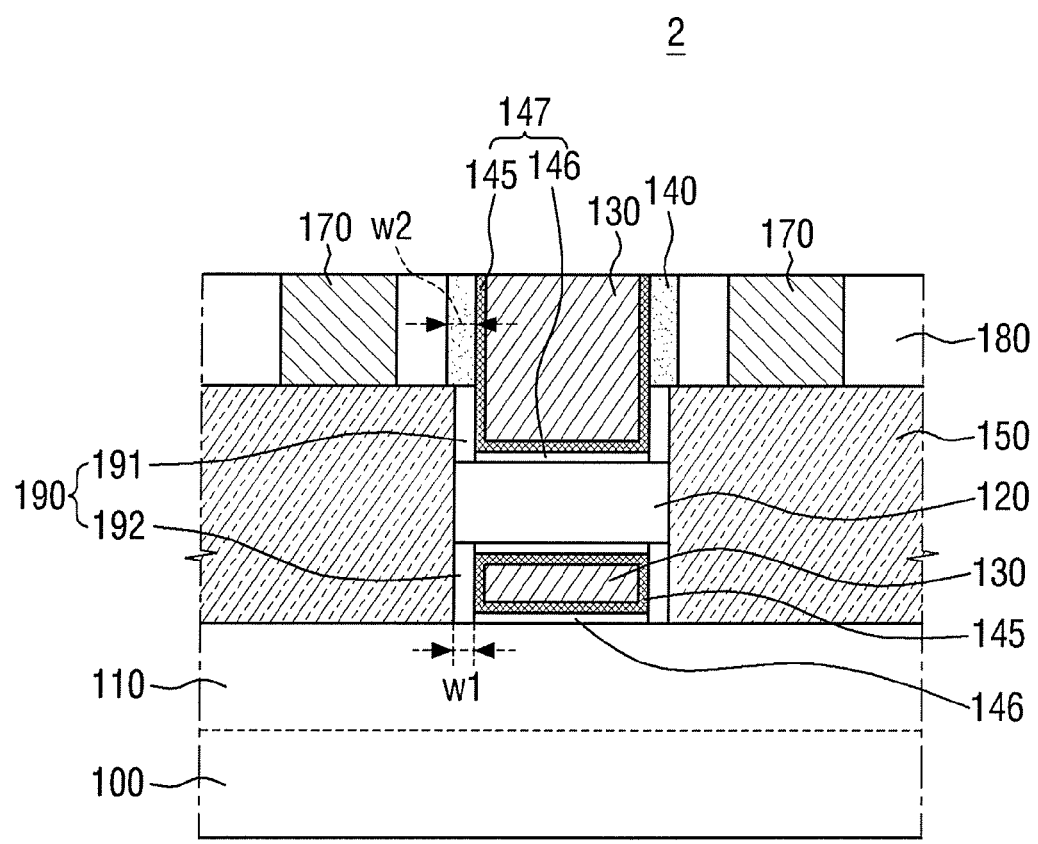
FIG. 5 is a view of a semiconductor device according to an exemplary embodiment of the present inventive concept.

FIG. 5 is a view of a semiconductor device according to an exemplary embodiment of the present inventive concept. For reference, FIG. 5 is a cross-sectional view taken along line A-A of FIG. 1.

Referring to FIG. 5, a semiconductor device 2 according to an exemplary embodiment of the present inventive concept further includes an insulating spacer 190.

The insulating spacer 190 may be arranged at both ends of the wire pattern 120. Each insulating spacer 190 may include a through-hole 140h through which the wire pattern 120 passes. The wire pattern 120 may penetrate the insulating spacer 190. The wire pattern 120 may contact the source/drain 150 through the through-hole 140h. The insulating spacer 190 may contact the entire circumference of the end of the wire pattern 120.

In the case where the corner portion of the wire pattern 120 that is surrounded by the gate electrode 130 is rounded through a trimming process or the like, the cross section of the end of the wire pattern 120 that comes in contact with the insulating spacer 190 may be different from the cross section of the wire pattern 120 that is surrounded by the gate electrode 130.

The insulating spacer 190 may include, for example, an oxide layer, but is not limited thereto. The insulating spacer 190 may electrically insulate an area between the source/drain 150 and the gate electrode 130.

As shown in FIG. 5, the insulating spacer 190 may include a first portion 191 and a second portion 192. The first portion 191 may be a portion of the insulating spacer 190 that is positioned above than the wire pattern 120. The second portion 192 may be a portion of the insulating spacer 190 that is positioned below the wire pattern 120. The first portion 191 and the second portion 192 may surround the wire pattern 120 above and below. The first portion 191 and the second portion 192 may be connected to each other to surround the wire pattern 120. Since the first portion 191 and the second portion 192 are connected to surround the wire pattern 120, they may not be clearly distinguished from each other.

The insulating spacer 190 may be positioned below the gate spacer 140. The insulating spacer 190 may not overlap the gate spacer 140 in the horizontal direction, but may overlap the gate spacer 140 in the vertical direction. The width W1 of the insulating spacer 190 in the horizontal direction may be narrower than the width W2 of the gate spacer 140 in the horizontal direction. In other words, the insulating spacer 190 may be thinner than the gate spacer 140. For example, the width W1 of the insulating spacer 190 may be about 2 nm to about 3 nm.

In other words, the insulating spacer 190 may be formed thin and may insulate an area between the gate electrode 130 and the source/drain 150. Reliability of the semiconductor device 2 can be increased by the insulating spacer 190. Further, the area of the source/drain 150 may be widened in comparison to a case where a thicker insulating spacer is formed.

Hereinafter, referring to FIG. 6, a semiconductor device according to an exemplary embodiment of the present inventive concept will be described. For convenience in explanation, the following description will focus primarily on elements and features different from those as described above with reference to FIGS. 1 to 5.

Figure 6:
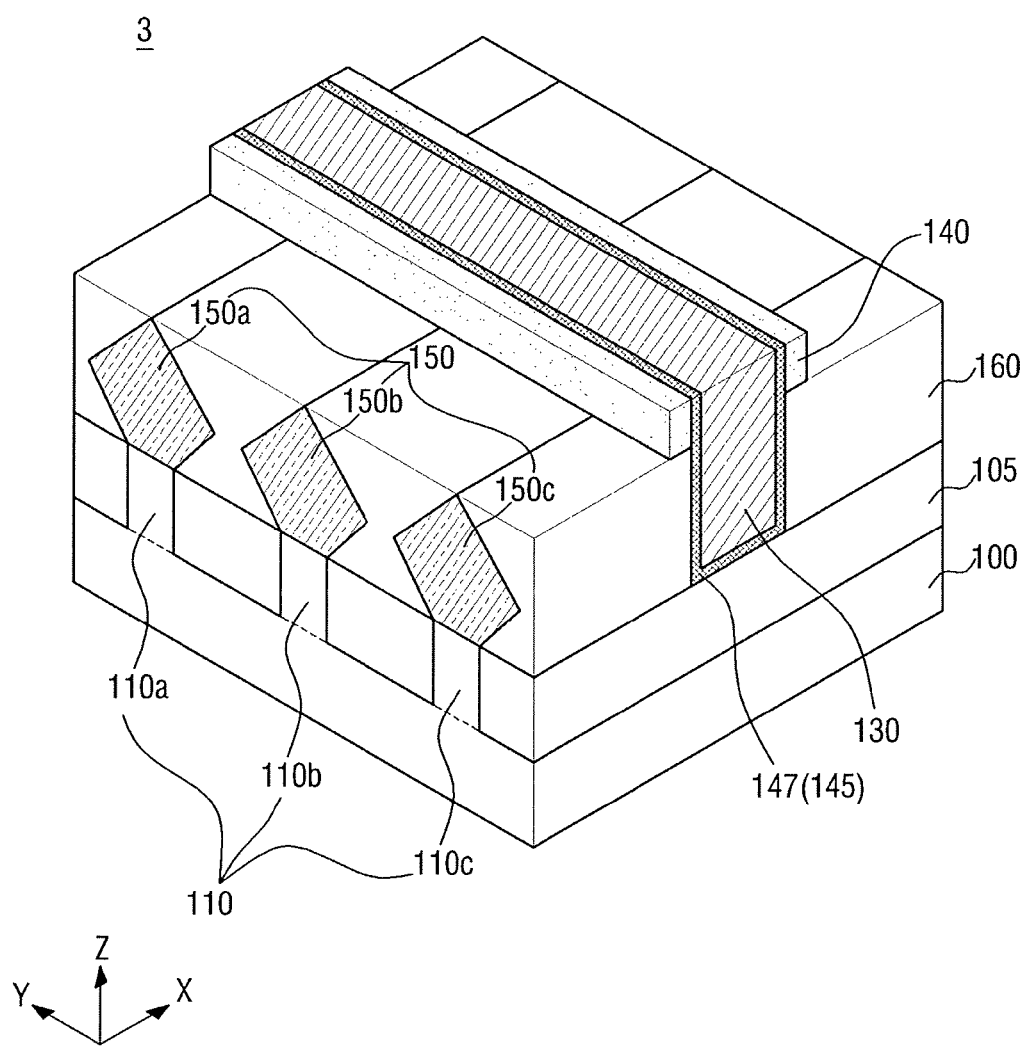
FIG. 6 is a view of a semiconductor device according to an exemplary embodiment of the present inventive concept.

FIG. 6 is a view of a semiconductor device according to an exemplary embodiment of the present inventive concept.

Referring to FIG. 6, a semiconductor device 3 according to an exemplary embodiment of the present inventive concept includes a fin pattern 110 including first to third fin patterns 110a to 110c, and a source/drain 150 including first to third sources/drains 150a to 150c.

The first to third fin patterns 110a to 110c may extend lengthwise in the first direction X. In other words, the first to third fin patterns 110a to 110c may include a long side that extends in the first direction X and a short side that extends in the second direction Y.

The first to third fin patterns 110a to 110c may be spaced apart from each other in the second direction Y. The first to third fin patterns 110a to 110c may be spaced apart from one another at predetermined intervals, but are not limited thereto. The field insulating layer 105 may be formed among the first to third fin patterns 110a to 110c.

The first to third sources/drains 150a to 150c may be formed on the first to third fin patterns 110a to 110c, respectively. The first to third sources/drains 150a to 150c may be formed on both sides of the gate electrode 130. Since the first to third sources/drains 150a to 150c are formed on the fin pattern 110, they may be connected to respective wire patterns.

In the semiconductor device 3 according to the current embodiment of the present inventive concept, each of the first to third fin patterns 110a to 110c is connected to one gate electrode 130, and thus the area of the source/drain 150 can be widened. Further, the resistance of the channel region is decreased, and thus the performance of the semiconductor device 3 can be increased.

Hereinafter, referring to FIG. 7, a semiconductor device according to an exemplary embodiment of the present inventive concept will be described. For convenience in explanation, the following description will focus primarily on elements and features different from those as described above with reference to FIGS. 1 to 6.

Figure 7:
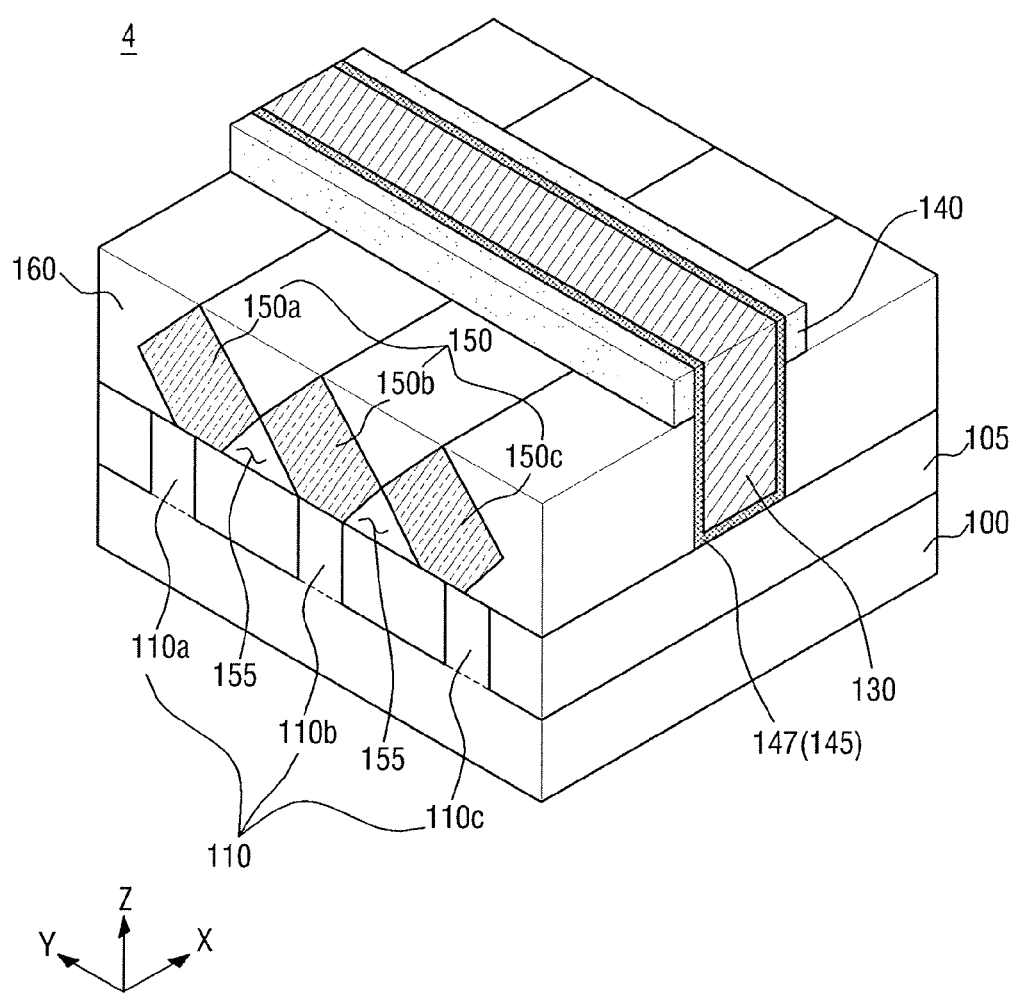
FIG. 7 is a view of a semiconductor device according to an exemplary embodiment of the present inventive concept.

FIG. 7 is a view of a semiconductor device according to an exemplary embodiment of the present inventive concept.

Referring to FIG. 7, a semiconductor device 4 according to an exemplary embodiment of the present inventive concept includes a source/drain 150 including first to third sources/drains 150a to 150c that are merged with one another and an air gap 155.

The first to third sources/drains 150a to 150c may be merged with one another. For example, the first to third sources/drains 150a to 150c may contact one another without being spaced apart from one another. In FIG. 7, it is illustrated that one corner of each pentagon shaped source/drain 150 comes into contact with a corner of another pentagon shaped source/drain 150. However, this is merely exemplary, and the shape of the source/drain 150 is not limited thereto.

Since the first to third sources/drains 150a to 150c contact one another, the air gap 155 may be formed among the first to third sources/drains 150a to 150c. The air gap 155 that is formed among the first to third sources/drains 150a to 150c may be an empty space of which all sides are enclosed. The side surface of the air gap 155 may be the first to third sources/drains 150a to 150c, and the bottom surface of the air gap 155 may be the field insulating layer 105.

The first interlayer insulating layer 160 may be formed on upper and side surfaces of the first to third sources/drains 150a to 150c. The first interlayer insulating layer 160 may surround the circumferences of the first to third sources/drains 150a to 150c except for the portion of the first to third sources/drains 150a to 150c where the air gap 155 is located. The first to third sources/drains 150a to 150c may have a polygonal shape, and thus, as illustrated in FIG. 7, concave groove portions may be formed on upper surfaces of the first to third sources/drains 150a to 150c. In this case, the first interlayer insulating layer 160 may fill the groove portions.

Like the semiconductor device 3 shown in FIG. 6, each of the first to third sources/drains 150a to 150c shown in FIG. 7 may be connected to one wire pattern. However, in FIG. 6, the first to third sources/drains 150a to 150c are spaced apart from one another, whereas in FIG. 7, they are merged with one another to form one source/drain.

In the semiconductor device 4 according to the current embodiment of the present inventive concept, since the first to third sources/drains 150a to 150a are merged with one another, the area of the source/drain 150 can be widened. Accordingly, a contact margin can be increased. Further, the resistance of the channel region is decreased, and thus the performance of the semiconductor device 4 can be increased.

Hereinafter, with reference to FIGS. 1, and 8 to 22, a method for fabricating a semiconductor device according to an exemplary embodiment of the present inventive concept will be described. The semiconductor device that is fabricated through processes with reference to FIGS. 1, and 8 to 22 is the semiconductor device 1 as described above with reference to FIGS. 1 to 4.

Figure 18:
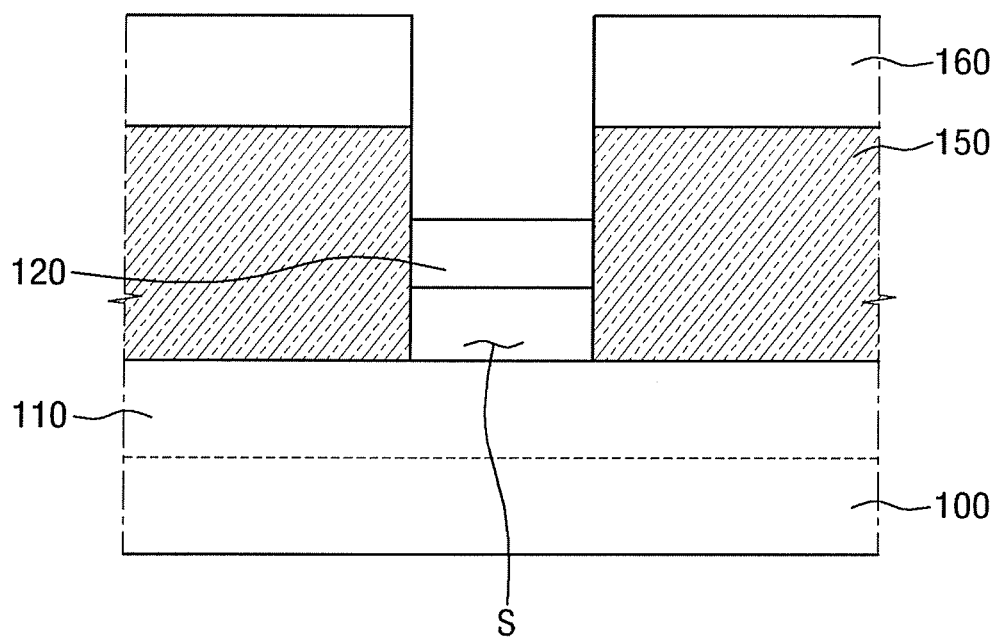
Figure 19:
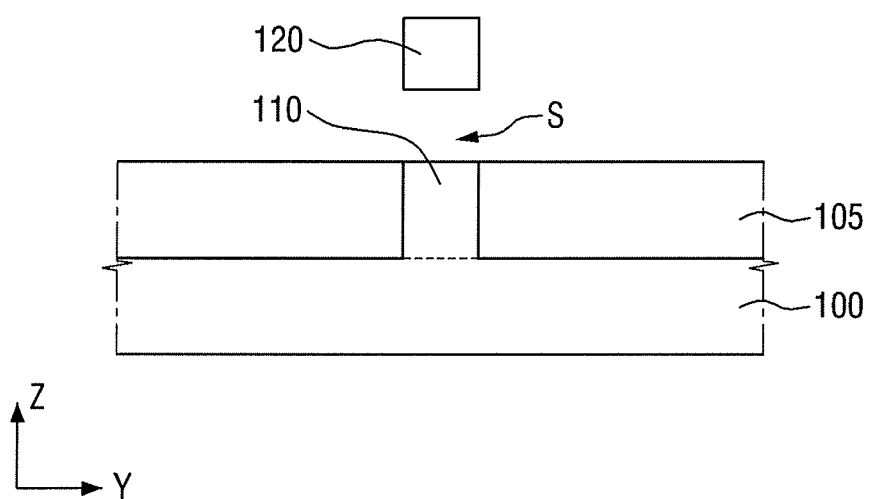

FIGS. 8 to 22 are views of a method for fabricating a semiconductor device according to an exemplary embodiment of the present inventive concept. For reference, FIGS. 16 to 18 are cross-sectional views taken along line D-D of FIG. 15, according to an exemplary embodiment of the present inventive concept, and FIGS. 17 to 19 are cross-sectional views taken along line E-E of FIG. 15, according to an exemplary embodiment of the present inventive concept.

Figure 8:
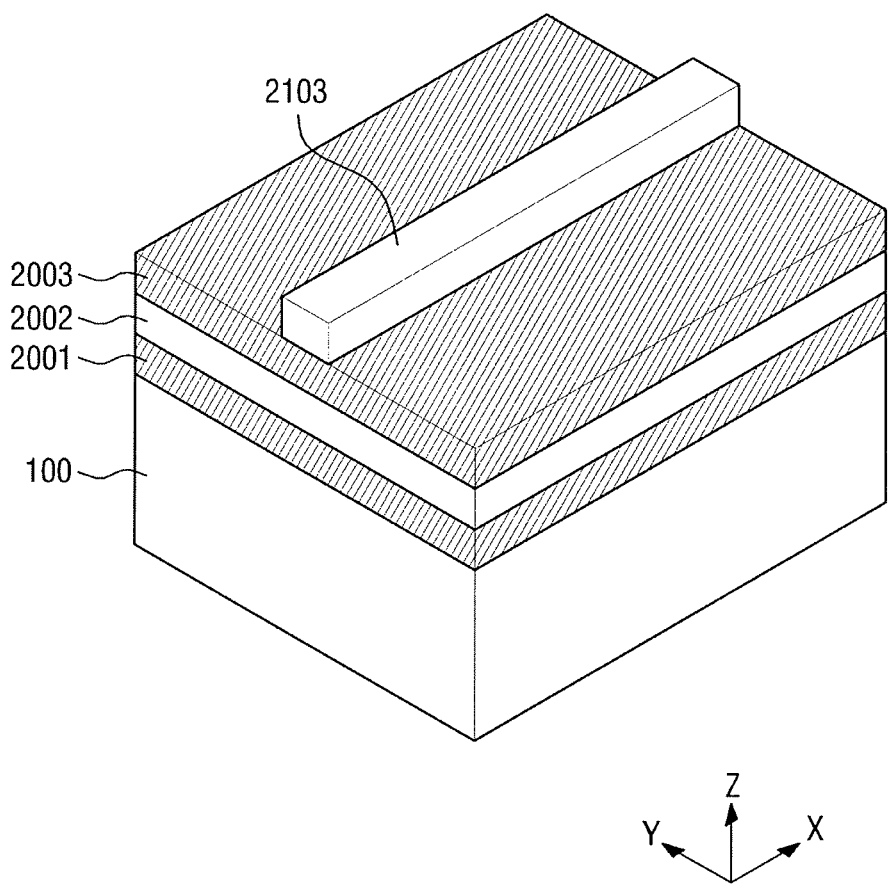
FIGS. 8, 9, 10, 11, 12, 13, 14, 15, 16, 17, 18, 19, 20, 21 and 22 are views of a method for fabricating a semiconductor device according to an exemplary embodiment of the present inventive concept.

Referring to FIG. 8, on a substrate 100, a first sacrificial layer 2001, an active layer 2002, and a second sacrificial layer 2003 are successively formed.

The first sacrificial layer 2001 and the second sacrificial layer 2003 may include the same material, and the first sacrificial layer 2001 and the active layer 2002 may include different materials. In explaining the method for fabricating a semiconductor device according to an exemplary embodiment of the present inventive concept, it is assumed that the first sacrificial layer 2001 and the second sacrificial layer 2003 include the same material. Further, the active layer 2002 may include a material having an etch selectivity over that of the first sacrificial layer 2001.

For example, the substrate 100 and the active layer 2002 may include a material that can be used as a channel region of a transistor. In other words, in the case of a PMOS, the active layer 2002 may include a material having a high hole mobility, and in the case of an NMOS, the active layer 2002 may include a material having a high electron mobility.

The first sacrificial layer 2001 and the second sacrificial layer 2003 may include a material having a lattice constant and a lattice structure that are similar to those of the active layer 2002. In other words, the first sacrificial layer 2001 and the second sacrificial layer 2003 may include a semiconductor material or a crystallized metal material.

In the method for fabricating a semiconductor device according to an exemplary embodiment of the present inventive concept, it is assumed that the active layer 2002 includes silicon, and the first sacrificial layer 2001 and the second sacrificial layer 2003 may include silicon germanium.

FIG. 8 illustrates one active layer 2002. However, this is merely for convenience in explanation, and the number of active layers is not limited thereto. In other words, the first sacrificial layer 2001 and the active layer 2002 may alternately form a plurality of pairs, and the second sacrificial layer 2003 may be formed on the uppermost active layer 2002.

Further, FIG. 8 illustrates that the second sacrificial layer 2003 is positioned at the uppermost portion of the laminated layer structure, but is not limited thereto. In other words, the active layer 2002 may be positioned at the uppermost portion of the laminated layer structure.

After the formation of the first sacrificial layer 2001, the active layer 2002, and the second sacrificial layer 2003, a first mask pattern 2103 is formed on the second sacrificial layer 2003. The first mask pattern 2103 may extend lengthwise in the first direction X.

The first mask pattern 2103 may be formed of, for example, a material that includes silicon oxide, silicon nitride, or silicon oxynitride.

Figure 9:
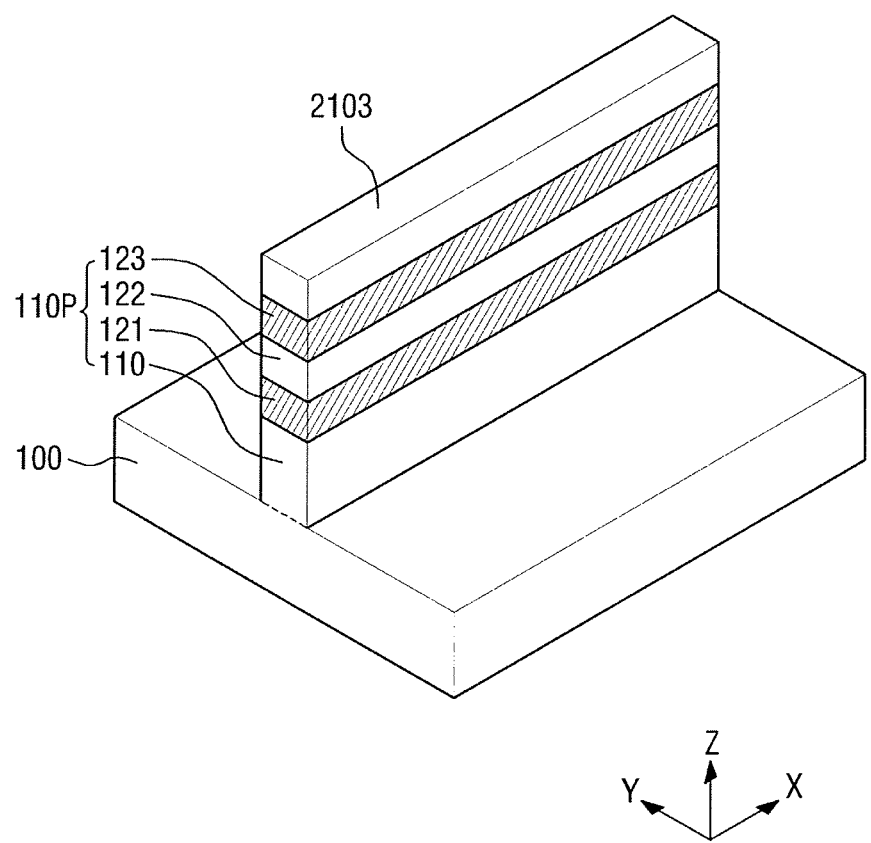

Referring to FIG. 9, a fin structure 110P is formed by performing an etching process using the first mask pattern 2103 as a mask.

The fin structure 110P may be formed through partial patterning of the second sacrificial layer 2003, the active layer 2002, the first sacrificial layer 2001, and the substrate 100.

The fin structure 110P may be formed on the substrate 100, and may project from the substrate 100. In other words, protrude from the substrate 100. Like the first mask pattern 2103, the fin structure 110P may extend along the first direction X.

In the fin structure 110P, a fin pattern 110, a first sacrificial pattern 121, a free wire pattern 122, and a second sacrificial pattern 123 are successively laminated on the substrate 100.

Figure 10:
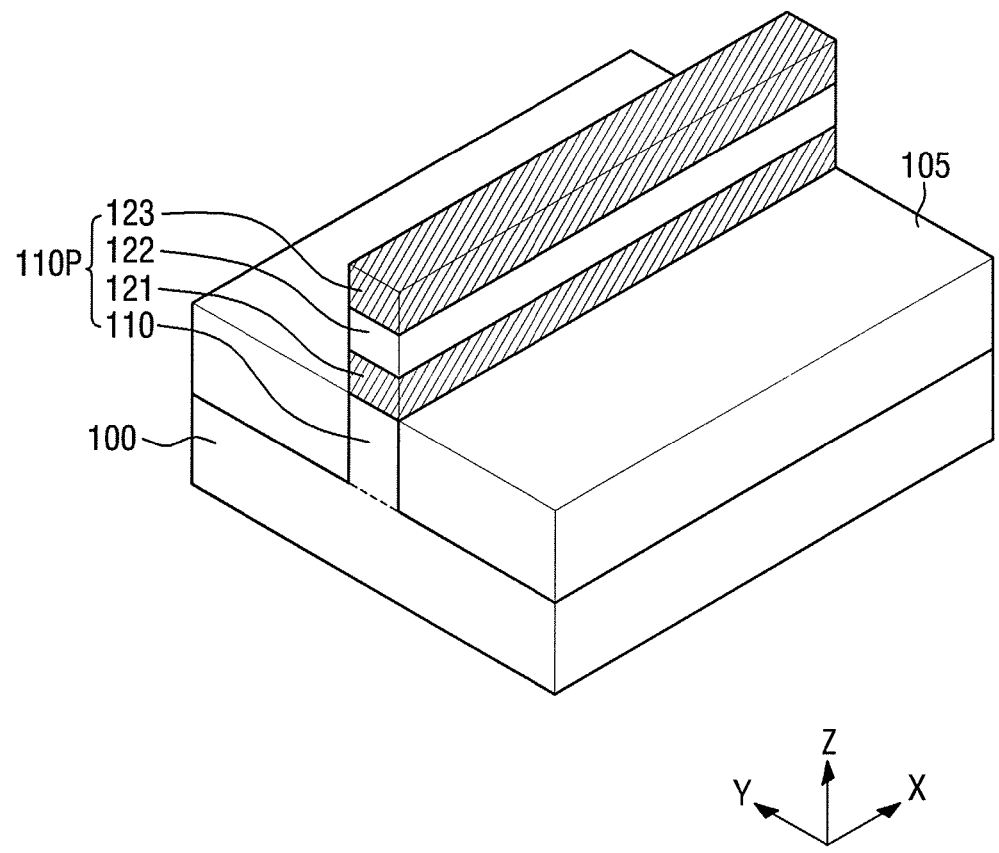

Referring to FIG. 10, a field insulating layer 105 that covers at least a part of a sidewall of the fin structure 110P may be formed on the substrate 100.

For example, the field insulating layer 105 that covers the fin structure 110P is formed on the substrate 100. Through a planarization process of the field insulating layer 105, an upper surface of the fin structure 110P and an upper surface of the field insulating layer 105 may be on the same plane.

As the planarization process is performed, the first mask pattern 2103 may be removed, but is not limited thereto.

After the planarization process, a part of the fin structure 110P is exposed by recessing the upper portion of the field insulating layer 105. The recess process may include a selective etching process. In other words, the fin structure 110P may be formed to project from the field insulating layer 105.

FIG. 10 illustrates that the second sacrificial pattern 123, the free wire pattern 122, and the first sacrificial pattern 121 project from the upper surface of the field insulating layer 105, and the sidewall of the fin pattern 110 is entirely surrounded by the field insulating layer 105, but are not limited thereto. In other words, through the process of recessing the upper portion of the field insulating layer 105, a part of the side wall of the fin pattern 110 may project from the upper surface of the field insulating layer 105.

Before and/or after the recess process for making a part of the fin structure 110P project from the upper surface of the field insulating layer 105, doping for adjusting a threshold voltage may be performed with respect to the free wire pattern 122. In the case where the semiconductor devices 1 to 4 according to exemplary embodiments of the present inventive concept are NMOS transistors, an impurity may be boron (B). In the case where the semiconductor devices 1 to 4 according to exemplary embodiments of the present inventive concept are PMOS transistors, the impurity may be phosphorus (P) or arsenide (As), but is not limited thereto.

Figure 11:
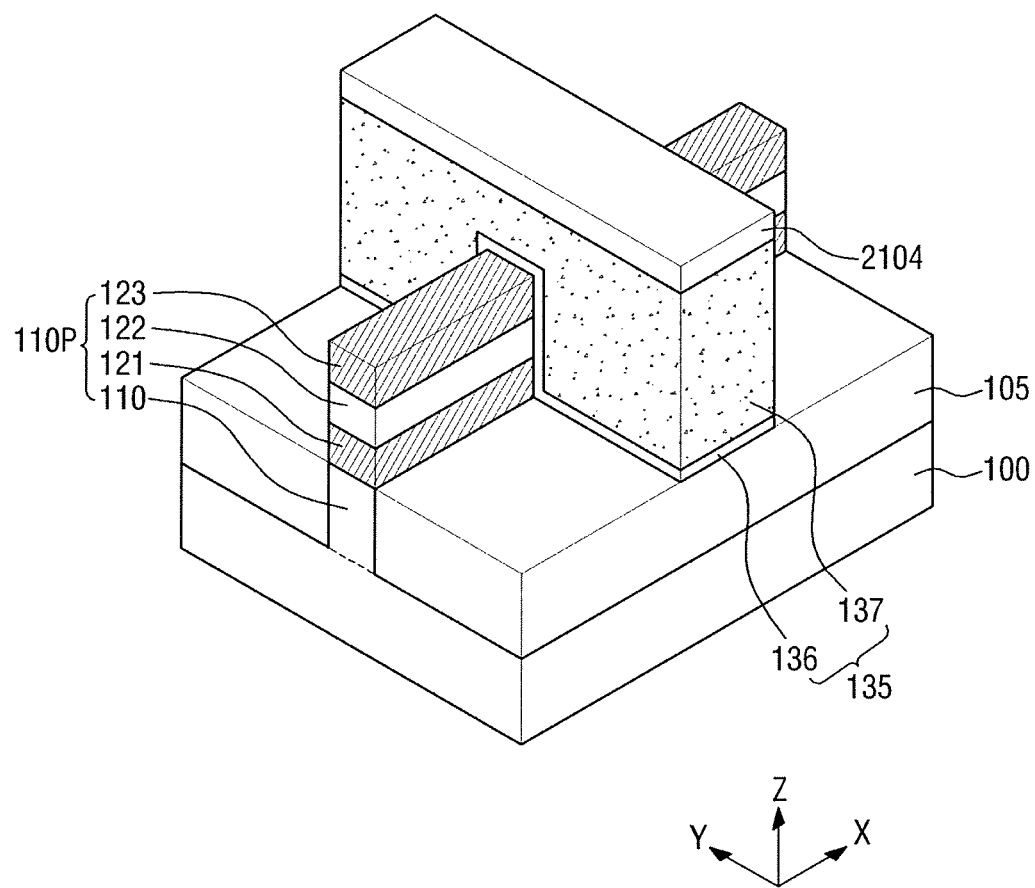

Referring to FIG. 11, by performing an etching process using the second mask pattern 2104, a dummy gate pattern 135 may be formed to extend in the second direction Y to cross the fin structure 110P. The dummy gate pattern 135 may be formed on the fin structure 110P.

The dummy gate pattern 135 may include a dummy gate insulating layer 136 and a dummy gate electrode 137. For example, the dummy gate insulating layer 136 may include a silicon oxide layer, and the dummy gate electrode 137 may include a non-silicon growth material. The non-silicon growth material may be, for example, SiN or oxide. In other words, the dummy gate electrode 130 may include a material that is not based on having to grow when the source/drain is grown.

Figure 12:
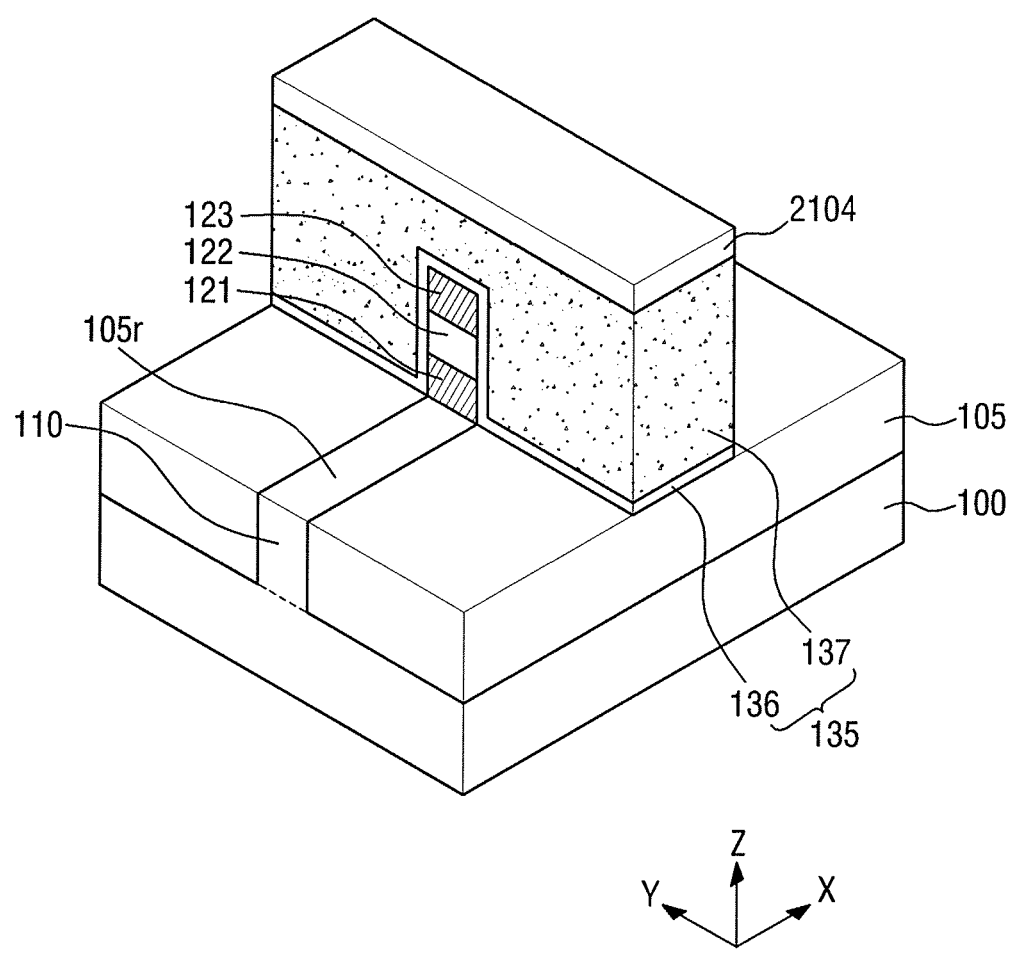

Referring to FIG. 12, the fin structure 110P that does not overlap the dummy gate electrode 137 is removed using the dummy gate electrode 137 as a mask. This way, a recess 150r may be formed in the fin structure 110P. The bottom surface of the recess 150r may be the fin pattern 110.

While the recess 150r is formed in the fin structure 110P, the first sacrificial pattern 121 and the second sacrificial pattern 123, which do not overlap the dummy gate electrode 137, may be removed. Further, while the recess 150r is formed in the fin structure 110P, the free wire pattern 122 that does not overlap the dummy gate electrode 137 may be removed to form the wire pattern 120.

Cross sections of the first sacrificial pattern 121, the second sacrificial pattern 123, and the wire pattern 122 may be exposed through the recess 150r.

Figure 13:
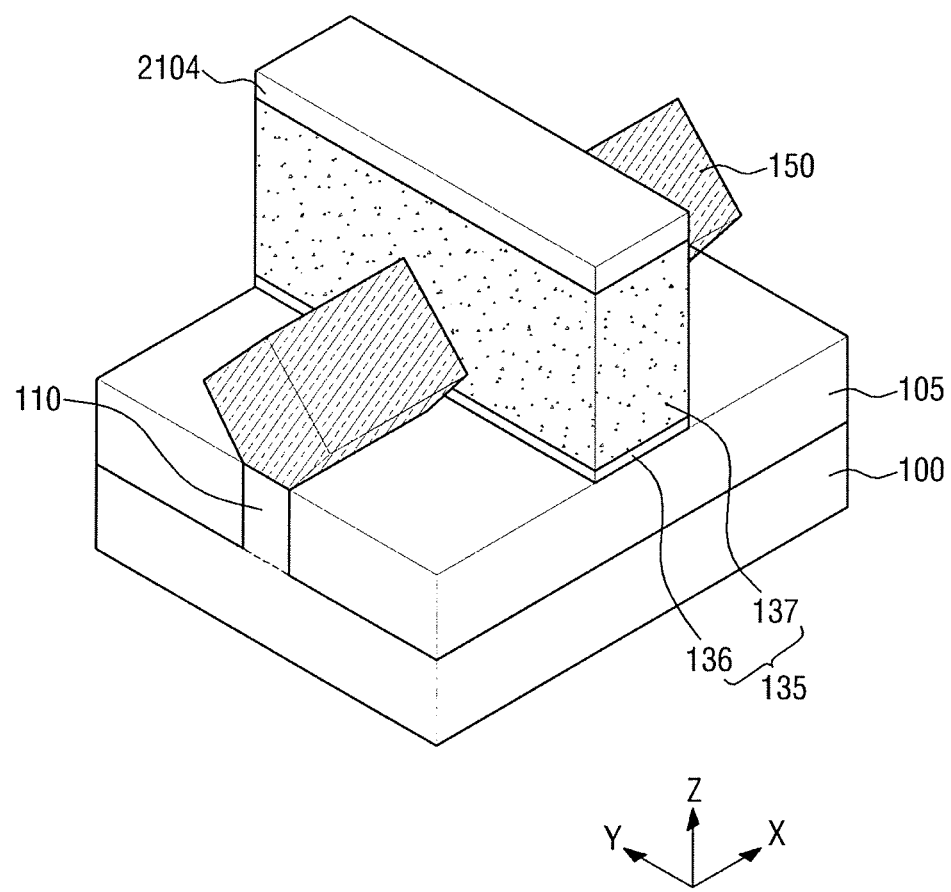

Referring to FIG. 13, a source/drain 150 that fills the recess 150r may be formed. The source/drain 150 may be formed on both sides of the dummy gate pattern 135.

The source/drain 150 may be formed using the exposed fin pattern 110 and wire pattern 120 as seed layers, but is not limited thereto. A seed layer may be further formed on the cross section of the wire pattern 120 and the fin pattern 110, which are exposed through the recess 150r.

The source/drain 150 may be formed to cover a part of the side surface of the dummy gate pattern 135. The source/drain 150 may contact the dummy gate electrode 137.

The source/drain 150 may be formed through an epitaxial process. Depending on whether the semiconductor devices 1 to 4 according to exemplary embodiments of the present inventive concept are n-type transistors or p-type transistors, materials of an epitaxial layer included in the source/drain 150 may differ from each other. Further, an impurity may be in-situ-doped in the epitaxial process.

Figure 14:
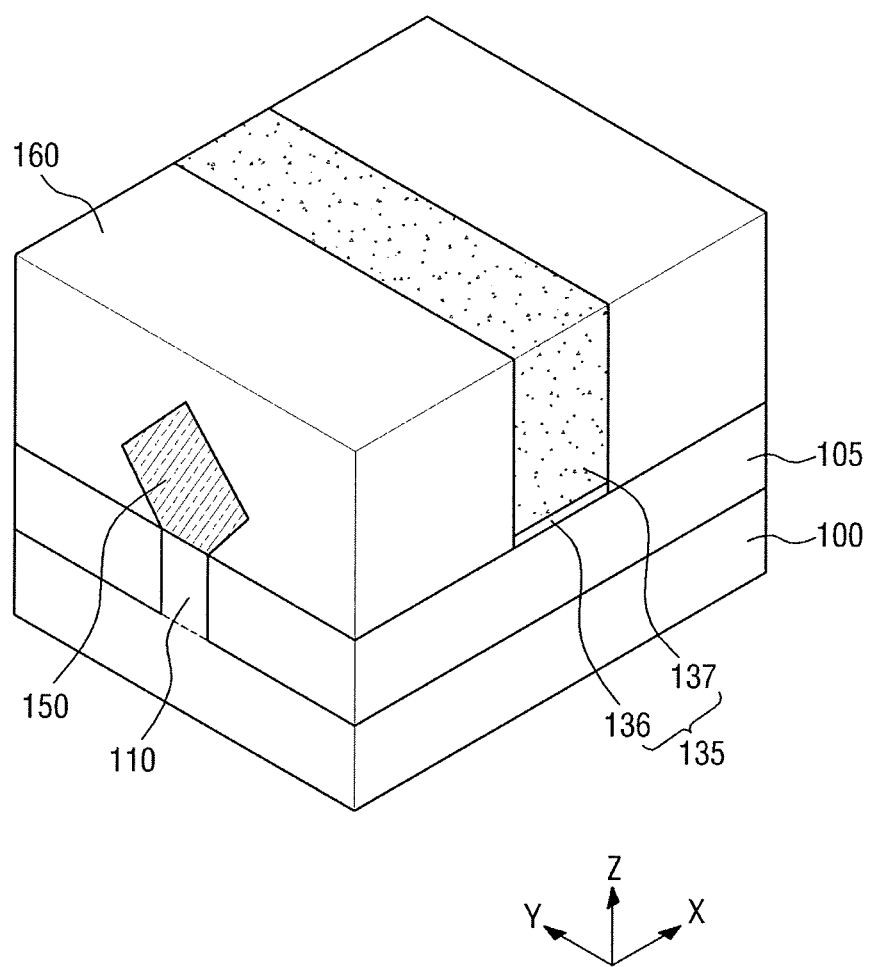

Referring to FIG. 14, a first interlayer insulating layer 160 that covers the source/drain 150 and the dummy gate pattern 135 may be formed on the field insulating layer 105.

The first interlayer insulating layer 160 may include a low-k material, an oxide layer, a nitride layer, or an oxynitride layer. The low-k material may be, for example, Flowable Oxide (FOX), Tonen SilaZen (TOSZ), Undoped Silica Glass (USG), Borosilica Glass (BSG), PhosphoSilaca Glass (PSG), BoroPhosphoSilica Glass (BPSG), Plasma Enhanced Tetra Ethyl Ortho Silicate (PETEOS), Fluoride Silicate Glass (FSG), High Density Plasma (HDP) oxide, Plasma Enhanced Oxide (PEOX), Flowable Chemical Vapor Deposition (FCVD) oxide, or a combination thereof.

The first interlayer insulating layer 160 is planarized until the upper surface of the dummy gate electrode 137 is exposed. As a result, the second mask pattern 2104 may be removed, and the upper surface of the dummy gate electrode 137 may be exposed.

Figure 15:
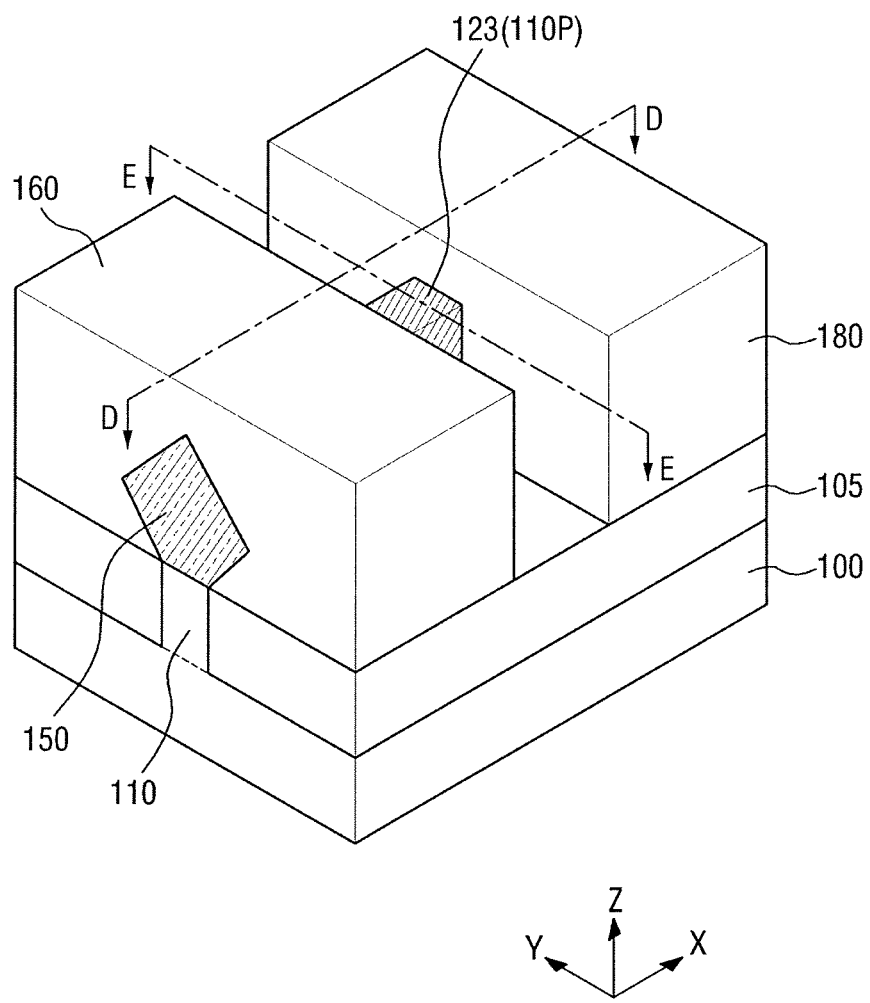
Figure 16:
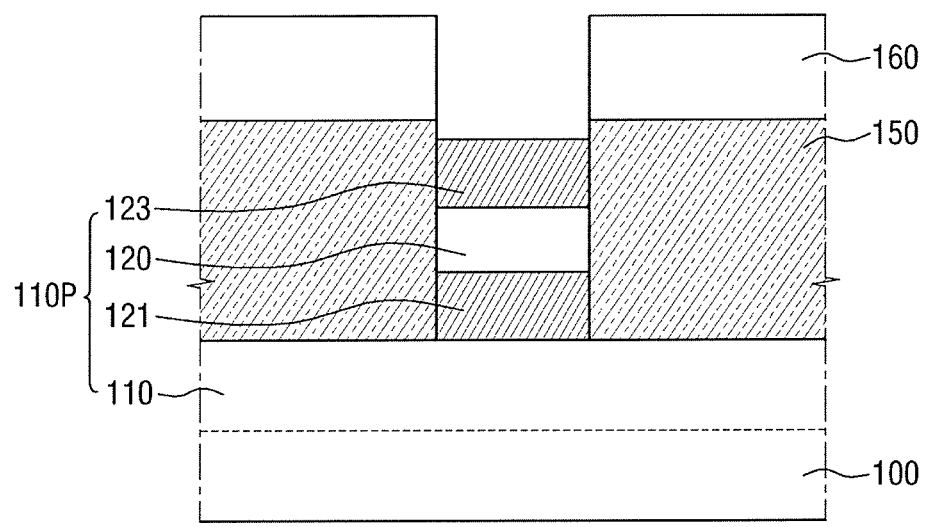
Figure 17:
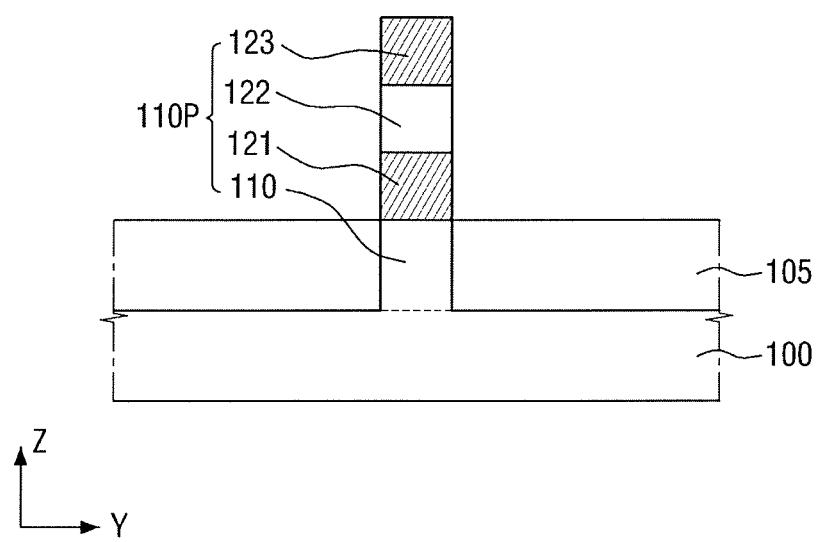

Referring to FIGS. 15 to 17, the dummy gate pattern 135, e.g., the dummy gate insulating layer 136 and the dummy gate electrode 137, may be removed.

Since the dummy gate insulating layer 136 and the dummy gate electrode 137 are removed, the fin structure 110P that overlaps the field insulating layer 105 and the dummy gate pattern 135 may be exposed. In other words, the first sacrificial pattern 121, the second sacrificial pattern 123, and the wire pattern 120, which overlap the dummy gate pattern 135, may be exposed.

Referring to FIGS. 18 and 19, the first sacrificial pattern 121 and the second sacrificial pattern 123 of the fin structure 110P may be removed.

This way, a space S may be formed between the wire pattern 120 and the fin pattern 110. Further, the wire pattern 120 may be formed on the fin pattern 110.

The removal of the first sacrificial pattern 121 and the second sacrificial pattern 123 that are positioned on the upper and lower portions of the wire pattern 120 may be performed, for example, using an etching process. In other words, an etch selectivity that removes the first and second sacrificial patterns 121 and 123 and keeps the wire pattern 120 may be used.

In addition, through the removal of the first sacrificial pattern 121 and the second sacrificial pattern 123, the inner side surface of the source/drain 150 may be exposed.

Figure 20:
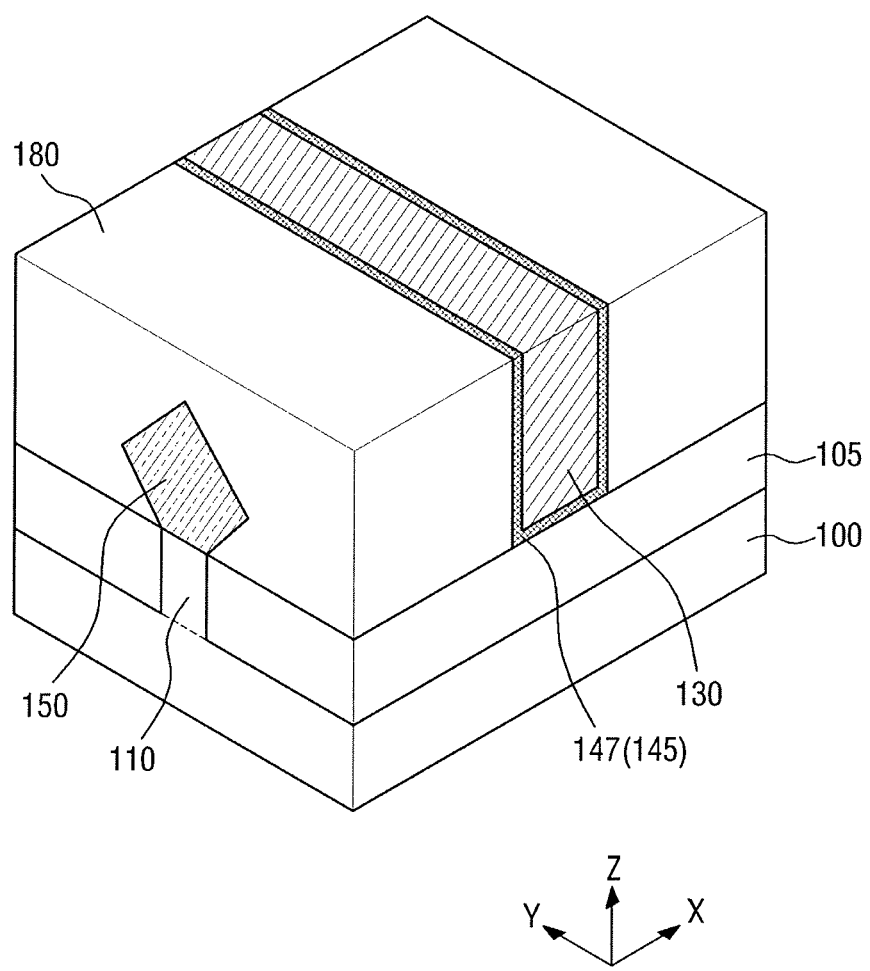

Referring to FIGS. 20 and 2, an interfacial layer 146 may be formed on the circumference of the wire pattern 120 and the upper surface of the fin pattern 110.

Then, a high-k insulating layer 145 may be formed along the side wall of the source/drain 150 and the circumference of the wire pattern 120. The high-k insulating layer 145 may contact the inner wall of the source/drain 150. Accordingly, a gate insulating layer 147 may be formed.

After forming the gate insulating layer 147, a gate electrode 130, which surrounds the wire pattern 120 and extends in the second direction Y, may be formed. The gate electrode 130 may be a replacement metal gate electrode.

Figure 21:
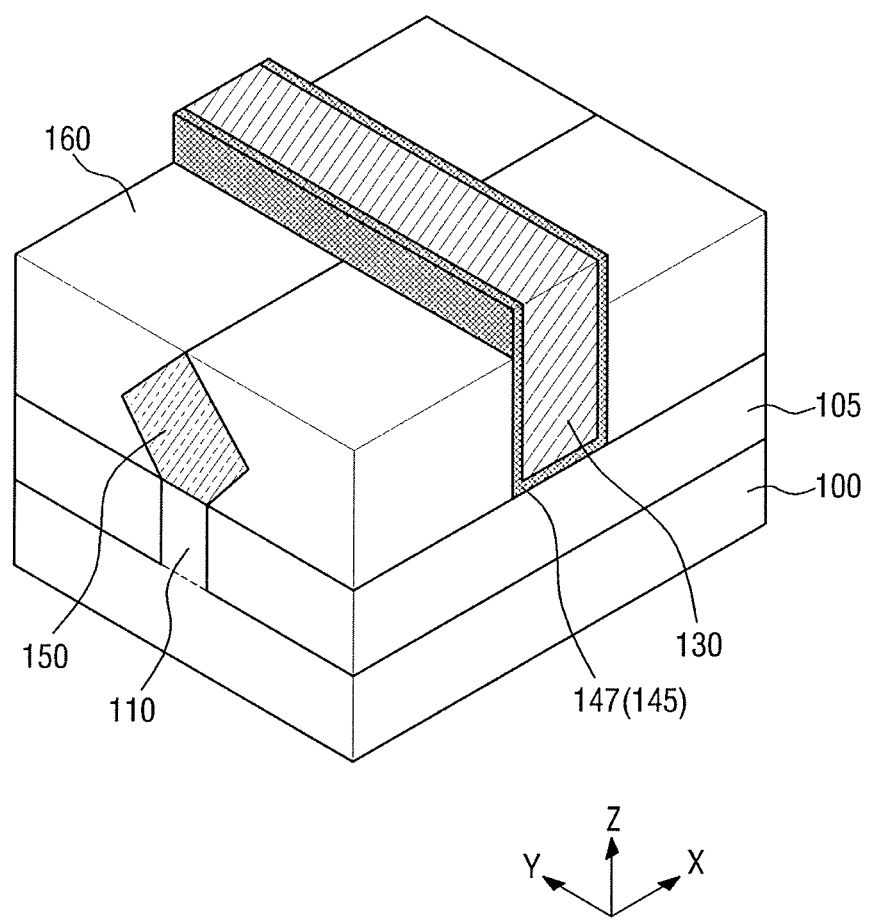

Referring to FIG. 21, a part of the first interlayer insulating layer 160 may be removed. Accordingly, the side surface of the gate insulating layer 147 may be partially exposed. Since the part of the first insulating layer 160 is removed, the uppermost portion of the source/drain 150 may be exposed. As illustrated in FIG. 21, the uppermost portion of the source/drain 150 may be a corner of the source/drain 150, but is not limited thereto.

Figure 22:
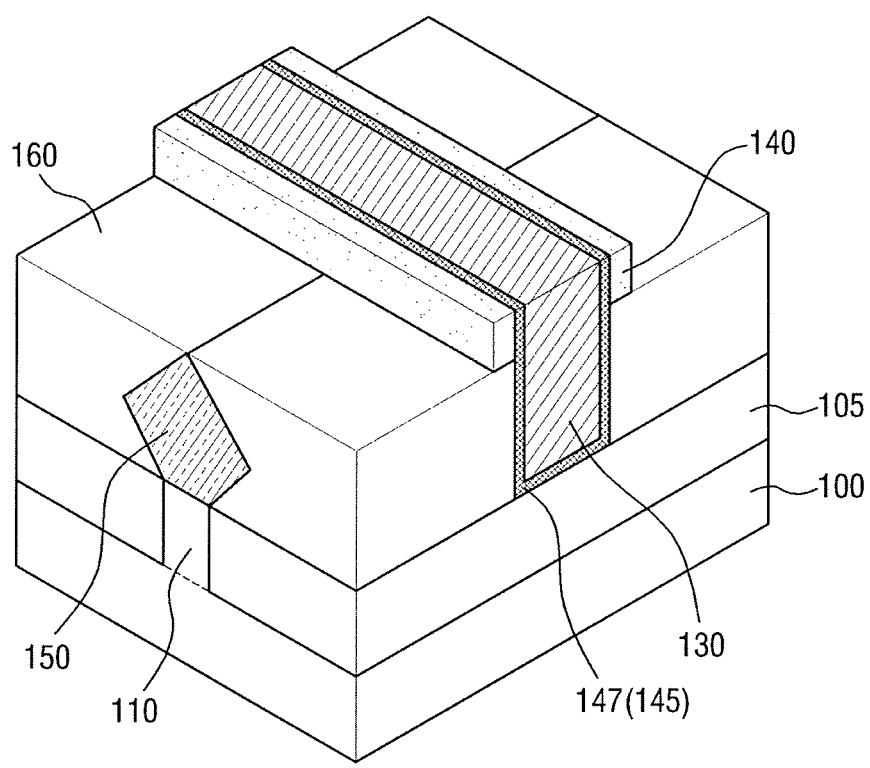

Referring to FIG. 22, a gate spacer 140 is formed. The gate spacer 140 may be formed on the source/drain 150 and the first interlayer insulating layer 160. The gate spacer 140 may be formed on both side walls of the gate electrode 130 to extend in the second direction Y.

The gate spacer 140 may include, for example, silicon nitride (SiN), silicon oxynitride (SiON), silicon oxide ($SiO_2$), silicon oxycarbonitride (SiOCN), or a combination thereof.

Referring to FIGS. 1 to 4, a second interlayer insulating layer 180 is formed. The second interlayer insulating layer 180 may be formed on the first interlayer insulating layer 160. The second interlayer insulating layer 180 may include a low-k material, an oxide layer, a nitride layer, or an oxynitride layer. The low-k material may be, for example, Flowable Oxide (FOX), Tonen SilaZen (TOSZ), Undoped Silica Glass (USG), Borosilica Glass (BSG), PhosphoSilaca Glass (PSG), BoroPhosphoSilica Glass (BPSG), Plasma Enhanced Tetra Ethyl Ortho Silicate (PETEOS), Fluoride Silicate Glass (FSG), High Density Plasma (HDP) oxide, Plasma Enhanced Oxide (PEOX), Flowable Chemical Vapor Deposition (FCVD) oxide, or a combination thereof. The second interlayer insulating layer 180 may include the same material as the first interlayer insulating layer 160, but is not limited thereto.

A contact 170 may be formed to penetrate the first interlayer insulating layer 160 and the second interlayer insulating layer 180. The contact 170 may be electrically connected to the source/drain 150. In other words, the contact 170 may directly contact the source/drain 150. The contact 170 may not be electrically connected to the gate electrode 130.

Figure 23:
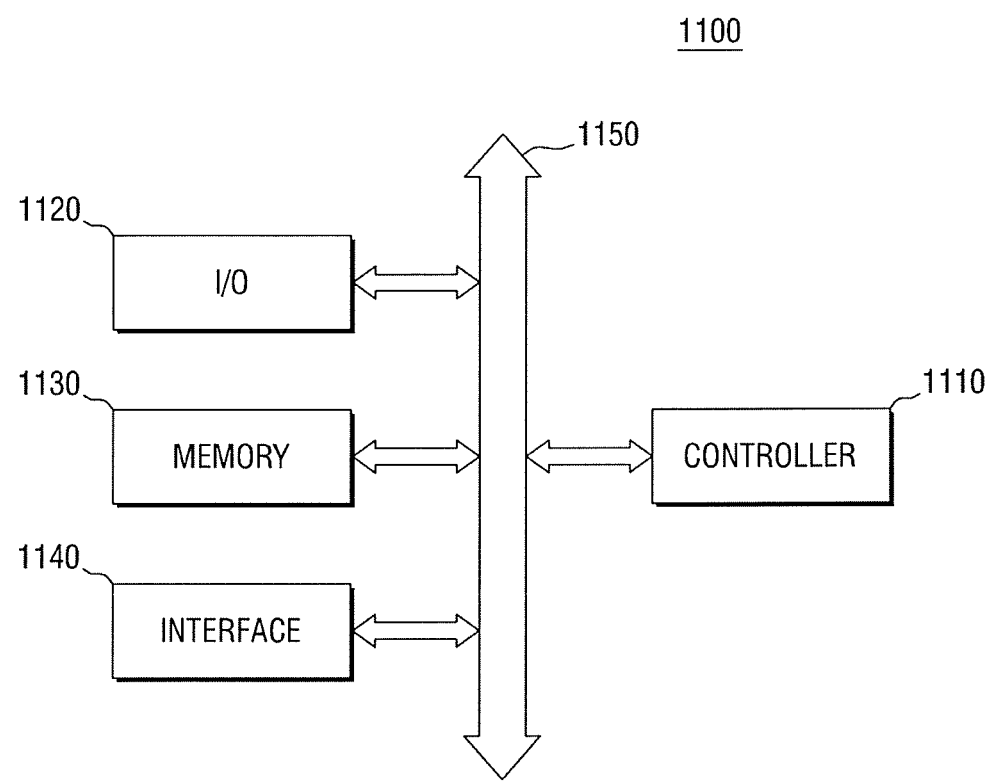
FIG. 23 is a block diagram of an electronic system that can include a semiconductor device according to exemplary embodiments of the present inventive concept.

FIG. 23 is a block diagram of an electronic system that can include a semiconductor device according to exemplary embodiments of the present inventive concept.

Referring to FIG. 23, an electronic system 1100 according to an exemplary embodiment of the present inventive concept may include a controller 1110, an input/output (I/O) device 1120, a memory 1130, an interface 1140, and a bus 1150. The controller 1110, the I/O device 1120, the memory 1130, and/or the interface 1140 may be coupled to one another through the bus 1150. The bus 1150 corresponds to paths through which data is transferred.

The controller 1110 may include a microprocessor, a digital signal processor, a microcontroller, or logic elements that can perform similar functions as the microprocessor, digital signal processor or microcontroller. The I/O device 1120 may include a keypad, a keyboard, and a display device. The memory 1130 may store data and/or commands. The interface 1140 may function to transfer the data to a communication network or receive the data from the communication network. The interface 1140 may be a wired or wireless type. For example, the interface 1140 may include an antenna or a wire/wireless transceiver. The electronic system 1100 may further include a high-speed dynamic random access memory (DRAM) and/or static random access memory (SRAM) as an operating memory for the operation of the controller 1110. The semiconductor device according to exemplary embodiments of the present inventive concept may be provided in the memory 1130, or may be provided as a part of the controller 1110 or the I/O device 1120.

The electronic system 1100 may be applied to a Personal Digital Assistant (PDA), a portable computer, a web tablet, a wireless phone, a mobile phone, a digital music player, a memory card, or all electronic devices that can transmit and/or receive information in wireless environments.

Figure 24:
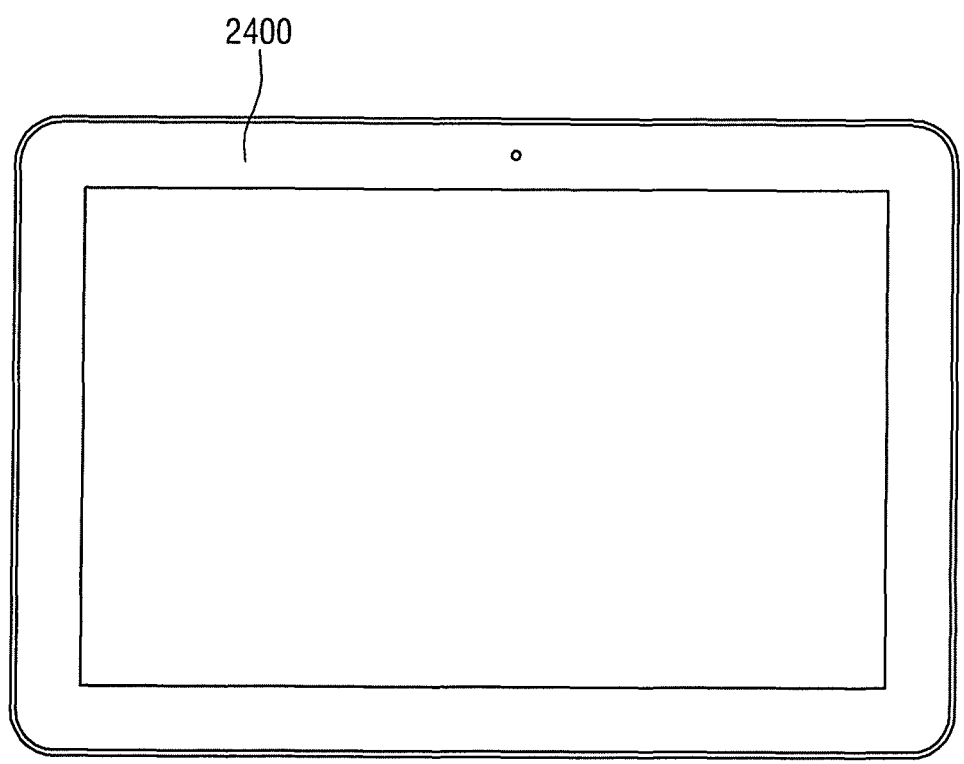
FIGS. 24 and 25 are views of semiconductor systems to which a semiconductor device according to exemplary embodiments of the present inventive concept can be applied.
Figure 25:
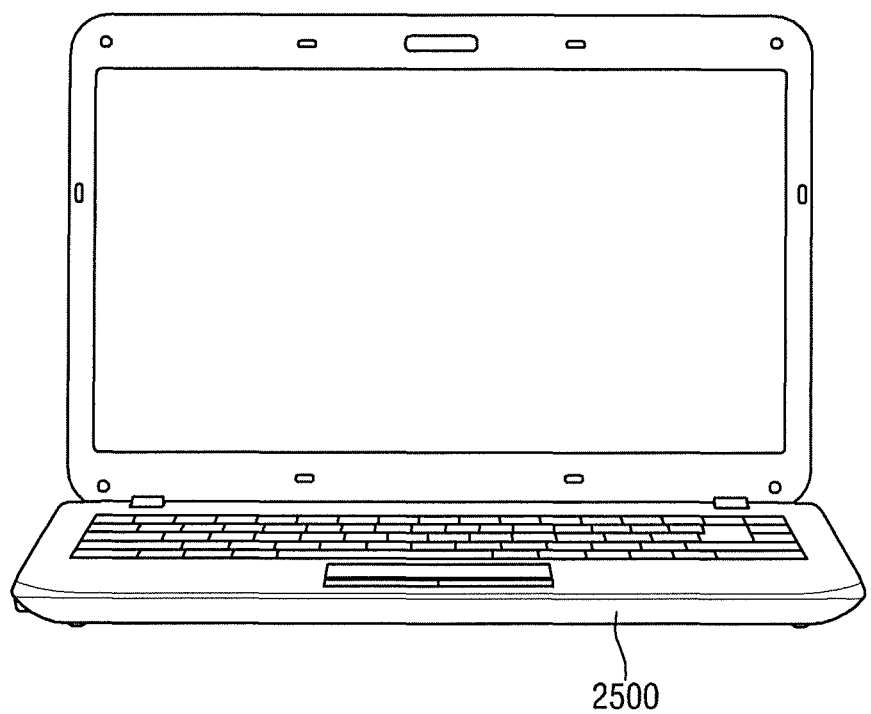

FIGS. 24 and 25 are views of semiconductor systems to which a semiconductor device according to exemplary embodiments of the present inventive concept can be applied. FIG. 24 illustrates a tablet PC 2400, and FIG. 25 illustrates a notebook computer 2500. At least one of the semiconductor devices according to exemplary embodiments of the present inventive concept may be used in the tablet PC 2400 or the notebook computer 2500. It is to be understood that the semiconductor device according to exemplary embodiments of the present inventive concept can be applied to other integrated circuit devices.

According to an exemplary embodiment of the present inventive concept, there is provided a semiconductor device that increases performance through extension of an area of a source/drain in a transistor have a gate all around structure, for example.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims.

What is claimed is:

1. A semiconductor device, comprising:
    a wire pattern spaced apart from a substrate and extended in a first direction;
    a gate electrode disposed around a circumference of the wire pattern and extended in a second direction that is different from the first direction;
    a source disposed on a first side of the gate electrode, a drain disposed on a second side of the gate electrode, the source and the drain connected to the wire pattern;
    a gate spacer disposed on first and second sidewalls of the gate electrode, on the source and on the drain; and
    an insulating layer formed on a part of an upper surface of the source and a part of an upper surface of the drain, wherein the gate spacer is formed on the insulating layer.

2. The semiconductor device of claim 1, further comprising a gate insulating layer formed between the gate electrode and the source and between the gate electrode and the drain.

3. The semiconductor device of claim 2, wherein an upper surface of the gate insulating layer is coplanar with an upper surface of the gate electrode.

4. The semiconductor device of claim 1, wherein the source and the drain extend in the first direction,
    the insulating layer is formed on a side surface of each of the source and the drain, and
    a first part of the gate spacer overlaps the source and the drain, and a second part of the gate spacer overlaps the insulating layer.

5. The semiconductor device of claim 1, further comprising a contact formed on the source or the drain and spaced apart from the gate electrode.

6. The semiconductor device of claim 1, wherein a lower surface of the gate spacer directly contacts an upper surface of the source and the drain.

7. A semiconductor device, comprising:
    a wire pattern spaced apart from a substrate and extended in a first direction;
    a gate electrode disposed around a circumference of the wire pattern and extended in a second direction that is different from the first direction;
    a source disposed on a first side of the gate electrode, a drain disposed on a second side of the gate electrode, the source and the drain connected to the wire pattern;
    a gate spacer disposed on first and second sidewalls of the gate electrode, on the source and on the drain; and
    a gate insulating layer formed between the gate electrode and the source and between the gate electrode and the drain,
    wherein the gate insulating layer comprises an interfacial layer and a high-k insulating layer.

8. A semiconductor device, comprising:
    a fin pattern protruding from a substrate and extending in a first direction;
    a field insulating layer disposed on first and second sides of the fin pattern;
    a wire pattern disposed above and apart from the fin pattern and extending in the first direction;
    a gate electrode disposed between the fin pattern and the wire pattern and above the wire pattern and extending in a second direction different from the first direction;
    a source disposed on a first side of the gate electrode and connected to the wire pattern;
    a drain disposed on a second side of the gate electrode and connected to the wire pattern;
    an insulating layer disposed on first and second sides of each of the source and the drain;
    first gate spacer disposed on a first sidewall of the gate electrode on the source and on the insulating layer; and
    a second gate spacer disposed on a second sidewall of the gate electrode on the drain and on the insulating layer.

9. The semiconductor device of claim 8, wherein the fin pattern and the wire pattern include the same material.

10. The semiconductor device of claim 8, further comprising a gate insulating layer disposed between the first gate spacer and the gate electrode and between the second gate spacer and the gate electrode.

11. The semiconductor device of claim 8, wherein the first and second gate spacers are spaced apart from the wire pattern.

* * * * *